US010365314B1

(12) United States Patent
Chengson et al.

(10) Patent No.: US 10,365,314 B1
(45) Date of Patent: Jul. 30, 2019

(54) ELECTRICAL SIGNATURE FAULT DETECTION

(71) Applicant: Juniper Networks, Inc., Sunnyvale, CA (US)

(72) Inventors: David P. Chengson, Aptos, CA (US); Ranjeeth Doppalapudi, San Jose, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 275 days.

(21) Appl. No.: 15/386,711

(22) Filed: Dec. 21, 2016

(51) Int. Cl.
*G01R 31/00* (2006.01)
*G01R 31/08* (2006.01)

(52) U.S. Cl.
CPC .................. *G01R 31/088* (2013.01)

(58) Field of Classification Search
USPC .................... 324/512, 537, 750.03
See application file for complete search history.

(56) References Cited

U.S. PATENT DOCUMENTS

2017/0129364 A1* 5/2017 Cui ...................... B60L 15/002

OTHER PUBLICATIONS

Baprawski, "SerDes System CTLE Basics," AMI Model Development, Mar. 22, 2012, 10 pp.
"Leading Edge Robotic Products," Robat, http://www.robat.ltd.uk/, retrieved on Nov. 2, 2016, http://www.robat.ltd.uk/products.php, 1 pp.

* cited by examiner

*Primary Examiner* — Vincent Q Nguyen
(74) *Attorney, Agent, or Firm* — Shumaker & Sieffert, P.A.

(57) ABSTRACT

Techniques are described for a method for detecting a fault. The method includes receiving, by a receiving electronic device, via a differential pair transmission line, from a transmitting electronic device, an electrical signal. The method further includes converting, by a receiving (Rx) serializer/deserializer (SerDes) operating at the receiving electronic device, the received electrical signal into a received digital electrical signal. The method further includes, determining, by one or more processors, an electrical signature of the received electrical signal from the received digital electrical signal when the received electrical signal is received by the receiving electronic device. The method further includes determining, by the one or more processors, based on the electrical signature, a position of a fault between the receiving electronic device and the transmitting electronic device. The fault causes the received electrical signal to be different than the transmitted electrical signal.

6 Claims, 20 Drawing Sheets

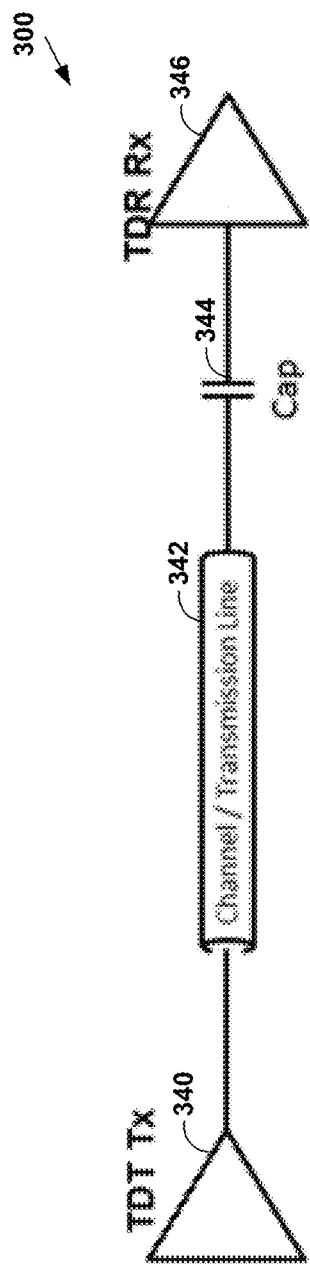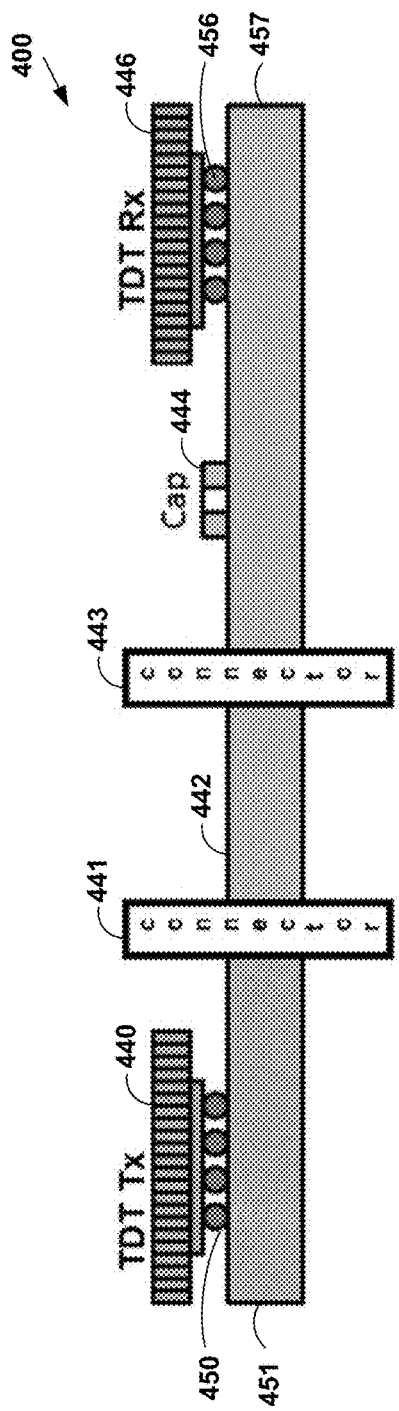
FIG. 3
FIG. 4

US 10,365,314 B1

ELECTRICAL SIGNATURE FAULT DETECTION

TECHNICAL FIELD

This disclosure relates to communication, and more particularly, to systems configured for high speed communication.

BACKGROUND

With the increase in the amount of data that needs to be communicated, communication systems need to evolve to operate at higher data rates. For instance, some recent communication systems operate in the 100 gigabits per second (Gbps) range. Scaling to these types of high data rate communication systems present design challenges for maintaining signal integrity, as well as for fault detection.

SUMMARY

In general, this disclosure describes techniques to enable self-detection of a fault along a signal path from a transmitting electronic device to a receiving electronic device. For example, a pluggable fabric card transmits, via a backplane, an electrical signal to a pluggable line card. Because of a fault on the signal path, the pluggable line card receives an electrical signal that is different than the electrical signal transmitted by the pluggable fabric card. In this example, the pluggable line card or another electronic device may, not only determine that a fault has occurred, but also determine a position, along the signal path, of the fault based on an electrical signature indicated by the electrical signal when received by the pluggable line card.

In techniques described in this disclosure, the processor of an electronic device, such as a wavelength division multiplexing (DWDM) line-card, switch, router or other device such as a chassis housing any of these devices, or an electronic device located away from these devices, determines an electrical signature indicated by an electrical signal when received by a receiving electrical device, such as a DWDM line-card, fabric card, or other receiving electrical device. Based on the electrical signature, the processor determines a position of a fault on a signal path that includes the various components between the receiving electronic device and a transmitting electrical device, such as a DWDM line-card, fabric card, or other transmitting electrical device. Examples of the various components between the transmitting electrical device and the receiving electronic device may include connectors, traces, capacitors, chip sockets, and other components between the transmitting electrical device and the receiving electronic device.

In one example, the disclosure describes a method for detecting a fault. The method includes receiving, by a receiving electronic device, via a differential pair transmission line, from a transmitting electronic device, an electrical signal. The electrical signal is generated from an electrical function outputted by the transmitting electronic device and wherein the received electrical signal is different than the transmitted electrical signal. The method further includes converting, by a receiving (Rx) serializer/deserializer (SerDes) operating at the receiving electronic device, the received electrical signal into a received digital electrical signal. The method further includes, determining, by one or more processors, an electrical signature of the received electrical signal from the received digital electrical signal when the received electrical signal is received by the receiving electronic device. The method further includes determining, by the one or more processors, based on the electrical signature, a position of a fault between the receiving electronic device and the transmitting electronic device. The fault causes the received electrical signal to be different than the transmitted electrical signal.

In one example, the disclosure describes an electronic device including a pluggable interface and a serializer/deserializer (SerDes). The pluggable interface is for coupling with a differential pair transmission line arranged on a backplane to electronically couple the electronic device with a transmitting electronic device. The SerDes is configured to receive, from the transmitting electronic device, via the pluggable interface, an electrical signal. The electrical signal is generated from an electrical function outputted by the transmitting electronic device. The received electrical signal is different than the transmitted electrical signal. The SerDes is configured to convert the received electrical signal into a received digital electrical signal. One or more processors are configured to determine an electrical signature of the received electrical signal from the received digital electrical signal when the received electrical signal is received by the SerDes and determine, based on the electrical signature, a position of a fault between the electronic device and the transmitting electronic device. The fault causes the received electrical signal to be different than the transmitted electrical signal.

In another example, the disclosure describes a system for communication. The system includes a first card, a second card, and a backplane. The first card includes a pluggable interface and a processor configured to generate, from an electrical function, an electrical signal and transmit, at the pluggable interface, the electrical signal. The second card includes a pluggable interface configured to receive, from the first card, the electrical signal. The received electrical signal is different than the electrical signal transmitted by the first card. The second card further includes a SerDes configured to convert the received electrical signal into a received digital electrical signal. The backplane includes a first receiving interface configured to receive the pluggable interface of the first card, a second receiving interface configured to receive the pluggable interface of the second card, and a trace configured to electronically couple the first receiving interface and the second receiving interface. One or more processors are configured to determine an electrical signature of the received electrical signal from the received digital electrical signal when the received electrical signal is received by the second card and determine, based on the electrical signature, a position of a fault between the first card and the second card. The fault causes the received electrical signal to be different than the electrical signal transmitted by the first card.

The details of one or more aspects of the disclosure are set forth in the accompanying drawings and the description below. Other features, objects, and advantages of the disclosure will be apparent from the description and drawings, and from the claims.

BRIEF DESCRIPTION OF DRAWINGS

FIG. 3 is a block diagram illustrating a first example of a differential pair transmission line connecting a receiving electronic device and a transmitting electronic device, in accordance with one or more examples described in this disclosure.

FIG. 4 is a block diagram illustrating a second example of a differential pair transmission line connecting a receiving electronic device and a transmitting electronic device, in accordance with one or more examples described in this disclosure.

DETAILED DESCRIPTION

Figure 1:
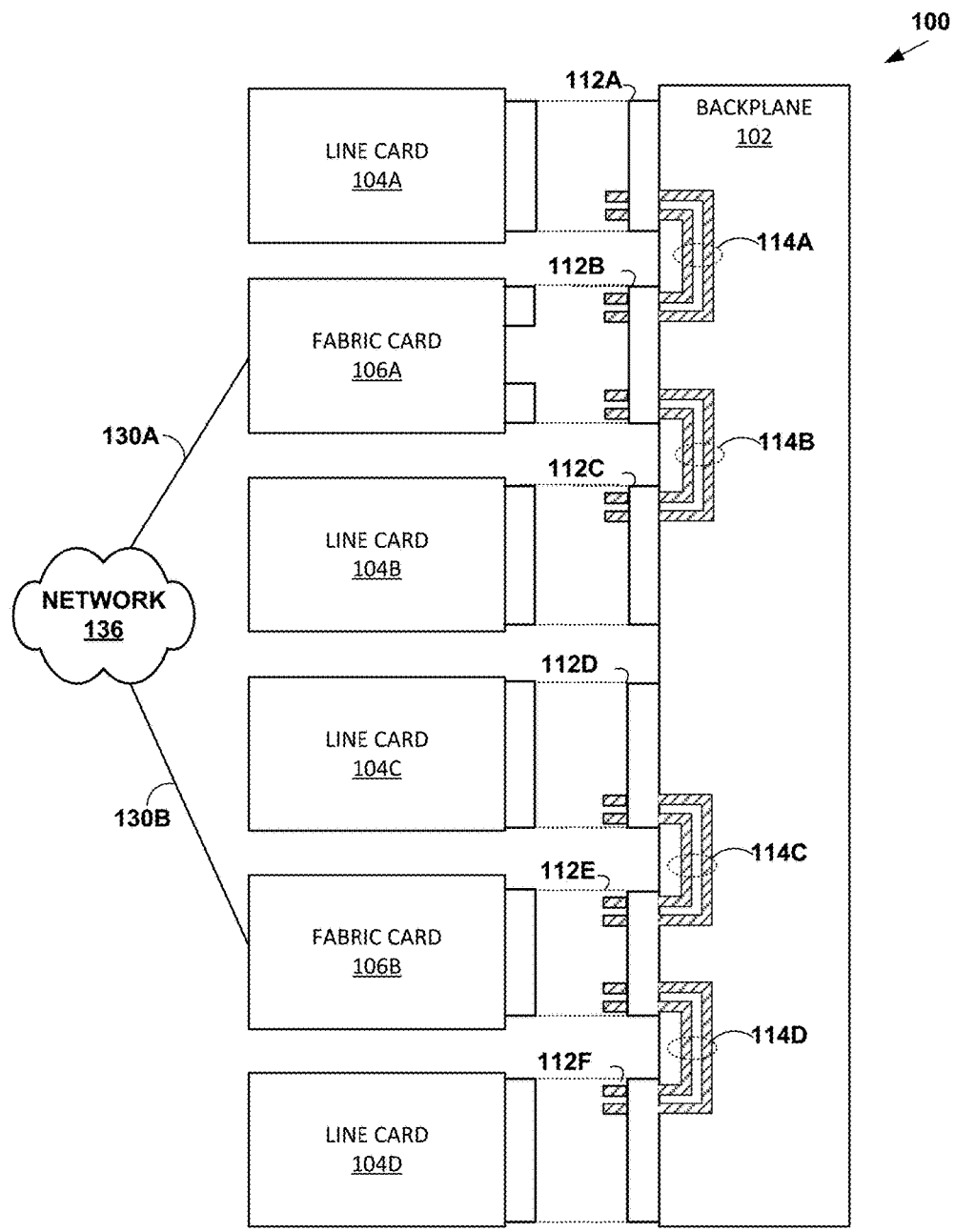
FIG. 1 is a block diagram illustrating a system configured for electrical signature fault detection, in accordance with one or more examples described in this disclosure.

FIG. 1 is a block diagram illustrating a system 100 configured for electrical signature fault detection, in accordance with one or more examples described in this disclosure. As shown, system 100 may include backplane 102, line cards 104A, 104B, 104C, 104D (collectively, line cards 104), and fabric cards 106A and 106B (collectively, fabric cards 106). Although four line cards 104 are shown in FIG. 1, it should be understood that additional or fewer line cards may be used. Similarly, although two fabric cards 106 are shown in FIG. 1, it should be understood that additional or fewer fabric cards may be used.

System 100 may be an optical communication device or a network device such as a wavelength-division multiplexing (WDM) system, including a dense wavelength division multiplexing (DWDM) system. However, aspects of this disclosure are not limited to WDM systems. For purposes of illustration only and for ease of description, the examples are described in context of a WDM system.

For example, backplane 102 may include a plurality of slots reserved for a plurality of boards, such as line cards 104 and fabric cards 106. As shown, pluggable interface 112A couples line card 104A to backplane 102, pluggable interface 112B couples fabric card 106A to backplane 102, pluggable interface 112C couples line card 104B to backplane 102, pluggable interface 112D couples line card 104C to backplane 102, pluggable interface 112E couples fabric card 106B to backplane 102, pluggable interface 112F couples line card 104D to backplane 102. Although FIG. 1 illustrates a single differential pair, pluggable interfaces 112A-F (collectively, pluggable interfaces 112) may be configured with more than one differential pair. For instance, each one of pluggable interfaces 112 may include multiple differential pairs that each correspond with a different channel for communication between one of line cards 104 and one of fabric cards 106.

Backplane 102 may include trace 114A, 114B, 114C, 114D (collectively traces 114). Although FIG. 1 illustrates a single differential pair of traces, backplane 102 may include additional pairs of traces for each one of pluggable interfaces 112. For instance, backplane 102 may include multiple differential pairs of traces that each correspond with a different channel for communication between one of line cards 104 and one of fabric cards 106.

In this disclosure, the term "differential pair transmission line" is used to encapsulate the various components from a chip die of one of line cards 104 to a chip die of one of fabric cards 106. For instance, a differential pair transmission line for connecting line card 104A to fabric card 106 may include one or more components of line card 104A, pluggable interface 112A, trace 114A, pluggable interface 112B, and one or more components of fabric card 106A. In general, the differential pair transmission line refers to the signal path from a chip die on one of line card 104 or fabric cards 106 to another one of line cards 104 or fabric cards 106.

Line cards 104 may receive a plurality of lower data rate electrical signals from multiple devices such as switches or routers that line cards 104 or another board serializes together into higher data rate electrical signals. Fabric cards 106 convert electrical signals to an optical signal for further transmission into network 136 via optical links 130A and 130B. Examples of network 136 include, but are not limited to, a wide area network (WAN), a local area network (LAN), or the Internet.

In the reverse, fabric cards 106 may receive higher data rate optical signals via optical links 130A or 130B from network 136, and convert the optical signals into electrical signals. Line cards 104 receive the electrical signals from fabric cards 106, and line cards 104 or another board deserializes the electrical signals into a plurality of lower data rate optical or electrical signals for transmission to the routers and switches.

As an amount of data that needs to be transmitted to and received from network 136 increases, a data rate at which line cards 104 need to forward to and from routers and switches or the number of parallel lanes between the line cards 104 and the routers or switches increases. For example, as routers and switches are being designed to receive and transmit data at ever higher data rates, system 100 needs to scale to the higher data rates to keep pace with data rates from the routers and switches. Further, to support such increased data rates, communication mechanisms between line cards 104 and fabric cards 106 may scale in size, for instance, by increasing a number of communication channels between line cards 104 and fabric cards 106. For example, although only FIG. 1 illustrates only 4 line cards 104 and 2 fabric cards 106 that are connected together using a single communication channel, system 100 may include more than two fabric cards 106, for instance, 20 or hundreds of line cards, and/or include more than 4 line cards, for instance, 20 or hundreds of fabric cards that are connected together using multiple communication channels (e.g., hundreds).

However, scaling a quantity of line cards 104 and fabric cards 106 and a scaling of a number of channels between line cards 104 and fabric cards 106 may presents several design challenges. For example, a fault in a connection in backplane 102 may cause a loss of networking data (e.g., packets) that may result in line cards 104 and fabric cards 106 from being unsuitable for use until the fault is cleared. For instance, when one or more components of line card 104A has failed, fabric card 106A may unreliably transmit and receive data. As an example, the error rate in the data that fabric card 106A receives from line card 104A may be greater than a threshold error rate. The errors in the data then propagate onto network 136. Similarly, in the reverse, there may be a fault in the line from fabric card 106A to line card 104A, and in this example, the error rate of the data that line card 104A receives may be greater than the threshold error rate, and the errors in the data propagate to the switches and routers.

Rather than identifying a fault by a technician replacing each one of line cards 104 and fabric cards 106 one by one and testing to see if the fault has been cleared, the techniques described in this disclosure provide for a scheme to allow for self-detection of a position of a fault. In some examples, line cards 104 and/or fabric cards 106 may self-detect a position of a fault. In some examples, a computer or system offsite may receive the data signals and detect a position of the fault.

Fabric card 106A may be configured to transmit an electrical signal to line card 104A. In this example, line card 104A may determine, based on an electrical signature of a received electrical signal, a position of the fault. For instance, line card 104A may determine that a fault has occurred at trace 114A. As another example, an offsite computer may receive a copy of the signal that line card 104A received or information indicative of the data that line card 104A received. The offsite computer may determine, based on an electrical signature of the received signal, a position of the fault.

For ease of description, the examples are described with respect to line cards 104 or fabric cards 106 determining a position of the fault. However, the techniques described in this disclosure may be extended to examples where another device (e.g., an offsite device or one not in the communication loop illustrated in FIG. 1) is configured to determine the position of the fault based on the electrical signature.

In one example, line card 104A receives, from fabric card 106A an electrical signal. One or more processors of line card 104A are configured to determine, based on an electrical signature of the received electrical signature, a position of a fault between line card 104A and the fabric card 106A. In another exemplary operation, fabric card 106A receives, from line card 104A an electrical signal. One or more processors of fabric card 106A are configured to determine, based on an electrical signature of the received electrical signature, a position of a fault between line card 104A and the fabric card 106A.

Figure 2:
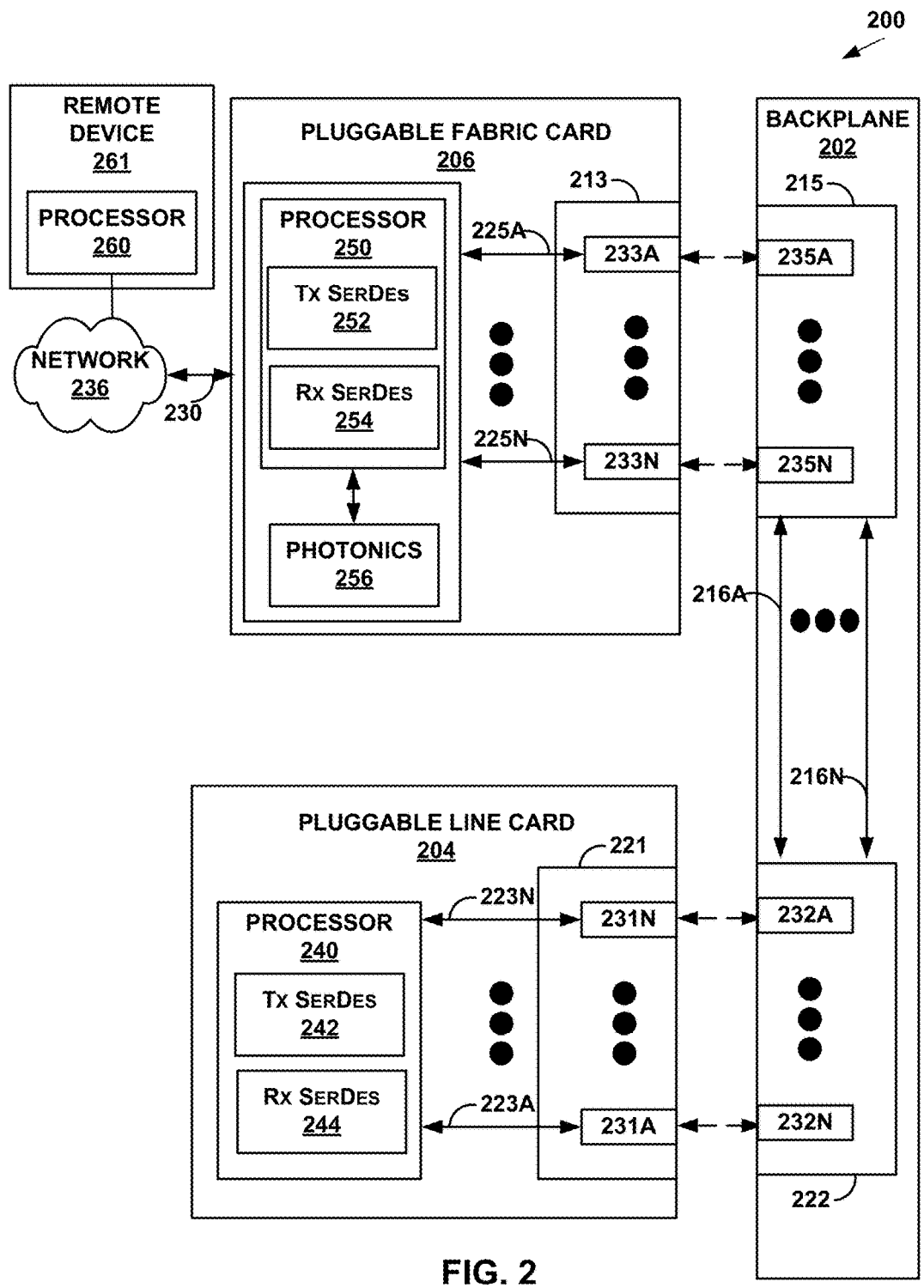
FIG. 2 is a block diagram illustrating a pluggable fabric card and pluggable line card connected by a backplane, in accordance with one or more examples described in this disclosure.

FIG. 2 is a block diagram illustrating a pluggable fabric card 206 and pluggable line card 204 connected by a backplane 202, in accordance with one or more examples described in this disclosure. System 200 may be an example of system 100 of FIG. 1. For example, pluggable fabric card 206 may be an example of fabric card 106 of FIG. 1. Additionally, or alternatively, pluggable line card 204 may be an example of line card 104 of FIG. 1. Additionally, or alternatively, backplane 202 may be an example of backplane 102 of FIG. 1.

Pluggable fabric card 206 may include processor 250 for performing operations of pluggable fabric card 206. For example, processor 250 may include a transmission (Tx) serializer/deserializer (SerDes) 252 and receiving (Rx) SerDes 254. Rx SerDes 254 may include an analog-to-digital converter (ADC) configured to convert a received electrical signal into a received digital electrical signal by quantizing the received electrical signal. For instance, an ADC of Rx SerDes 254 may convert a received analog electrical signal by quantizing a comparison of a voltage across a positive channel received by Rx SerDes 254 and a negative channel received by Rx SerDes 254. A digital-to-analog converter (DAC) of Tx SerDes 252 may convert a digital electrical signal into an analog electrical signal by inverse quantizing the digital electrical signal.

Examples of processor 250 may include, but are not limited to, a digital signal processor (DSP), a general purpose microprocessor, an application specific integrated circuit (ASIC), a field programmable logic array (FPGA), a combination thereof, or other equivalent integrated or discrete logic circuitry. Processor 250 may include fixed-function circuitry and programmable circuitry. For example, Tx SerDes 252 and Rx SerDes 254 may be fixed-function circuitry, or may be programmable circuitry. Processor 250 may include additional hardware circuit to perform various operations.

Photonics 256 may convert an electric signal into an optical signal and/or convert an optical signal into an electrical signal. Examples of photonics 256 may include, but are not limited to, a digital signal processor (DSP), a general purpose microprocessor, an application specific integrated circuit (ASIC), a field programmable logic array (FPGA), a combination thereof, or other equivalent integrated or discrete logic circuitry. Photonics 256 may include fixed-function circuitry and programmable circuitry.

Pluggable line card 204 may include processor 240 for performing operations of pluggable line card 204. For example, processor 240 may include one or more of Tx SerDes 242 and Rx SerDes 244. An ADC of Rx SerDes 244 may convert a received electrical signal into a received digital electrical signal by quantizing the received electrical signal. A DAC of Tx SerDes 242 may convert a digital electrical signal into an analog electrical signal by inverse quantizing the digital electrical signal. Examples of processor 240 may include, but are not limited to, a digital signal processor (DSP), a general purpose microprocessor, an application specific integrated circuit (ASIC), a field programmable logic array (FPGA), a combination thereof, or other equivalent integrated or discrete logic circuitry. Similar to processor 250, processor 240 may include fixed-function circuitry and programmable circuitry. For example, Tx SerDes 242 and Rx SerDes 244 may be fixed-function circuitry, or may be programmable circuitry. Processor 240 may include additional hardware circuit to perform various operations.

Tx SerDes 252 and Rx SerDes 254 of pluggable fabric card 206 and Tx SerDes 242 and Rx SerDes 244 of pluggable line card 204 may form a SerDes system. Generally, a SerDes system may operate on a lossy channel that transmits data at high data rates using a distorted signal. As such, Tx SerDes 242 and 252 and Rx SerDes 244 and 254 may be configured to perform a common equalizer approach to remove distortion in a signal transmitted between pluggable fabric card 206 and pluggable line card 204. An example of a common equalizer approach may include, but is not limited to, continuous time linear equalizer (CTLE). Examples of CTLE may be found in, but are not limited to, the IBIS algorithmic model interface (AMI).

Tx SerDes 242 may be configured to provide pre-emphasis of high frequency leading edge of bit transitions output to Rx SerDes 254. For example, Tx SerDes 242 may be configured to apply a high pass filter (HPF) function with poles and zeros to data prior to output to Rx SerDes 254. Additionally, or alternatively, Tx SerDes 242 may be configured to apply a feed-forward equalizer (FFE) CTLE function to data prior to output to Rx SerDes 254.

Tx SerDes 242 may apply a HPF function using a single pole and zero, according to the following equation.

$$H(s)=K*(s-z)/(s-p)$$

In the above equation, 'z' may be the zero at 1.3625 GHz and 'p' may be the pole at 6.5 GHz. In some examples, Tx SerDes 242 may be further configured to apply the HPF function with high frequency poles to reduce high frequency noise. Although applying a HPF function is discussed above with Tx SerDes 242, Tx SerDes 252 may be configured to perform one or more techniques for applying a HPF function.

Tx SerDes 242 may be configured to apply a FFE CTLE function to data prior to output to Rx SerDes 254. Generally, Tx SerDes 242 may be further configured to apply a FFE CTLE function to provide emphasis using delays, gains, and a summer. For example, Tx SerDes 242 may apply a FFE CTLE that is a finite impulse response (FIR) filter. In this instance, Tx SerDes 242 may propagate, data for output to Rx SerDes 254, through a series of delay lines. Each delay may be equal to one bit unit time interval. In this example, each delay may be 100 picoseconds (e.g., set up with 16 samples per bit). Tx SerDes 242 may sample the signal before and after each delay line and multiply the signal by FIR tap coefficients $C_k$. In this instance, C−1 is the first pre-cursor tap. C0 is the main cursor tap. C1 and C2 are the first and second post-cursor taps. The pre and post cursor taps may compensate for inter-symbol interference (ISI) jitter before and after the main cursor, respectively. Tx SerDes 242 may sum the outputs from the FIR taps to produce the FFE CTLE output for transmission to Rx SerDes 254. The number of taps may depend on the length of the channel impulse response relative to one bit unit time interval. In some examples, Tx SerDes 242 may be further configured to apply the FFE CTLE function with high frequency poles to reduce high frequency noise. Although applying a FFE CTLE function is discussed above with Tx SerDes 242, Tx SerDes 252 may be configured to perform one or more techniques for applying a FFE CTLE function.

Rx SerDes 254 may be configured to apply CTLE to a signal received from Tx SerDes 252, which is referred to as discrete time linear equalizer (DLE) CTLE to distinguish from one or more CTLE techniques performed by Tx SerDes 242. In some examples, Rx SerDes 254 may apply a FIR filter on a signal received from Tx SerDes 242. Rx SerDes 254 may operate on the analog input signal after it has been sampled by a sample-and-hold circuit using the FIR filter. Assuming that there are N samples per data time interval, Rx SerDes 254 may be configured to operate with FIR taps designed to subtract ISI effects from adjacent bits. In instances where Rx SerDes 254 applies a DLE CTLE designed to equalize for 3 pre-cursor pulses and 5 post-cursor pulses about the main pulse, Rx SerDes 254 may apply a CLE CTLE having N*9 taps. Rx SerDes 254 may sample at one point per data time interval the output of the DLE CTLE for data detection. Rx SerDes 254 may cancel ISI at the data detection sample points.

Rx SerDes 254 may define a reference channel frequency response, H_ref(s) that has zero or low ISI at the data detection sample points. For instance, Rx SerDes 254 may define the reference channel frequency response to be a raised cosine characteristic or another characteristic as desired. Rx SerDes 254 may multiply the inverse of the reference channel frequency response, 1/H_TL(s), by the reference channel response, H_ref(s) to determine a desired DLE CTLE frequency response, H_dle(s). In some examples, Rx SerDes 254 may be further configured to apply the DLE CTLE function with high frequency poles to reduce high frequency noise. This process discussed here presumes that the channel frequency response does not have noise distortions in the frequency response. If the channel frequency response does have noise distortions in the frequency response, Rx SerDes 254 may apply an averaging processes to smooth out the noise to produce a frequency response that has a high signal to noise ratio. Although applying a DLE CTLE function is discussed above with Rx SerDes 254, Rx SerDes 244 may be configured to perform one or more techniques for applying a DLE CTLE.

Tx SerDes 252 and Rx SerDes 254 of pluggable fabric card 206 and Tx SerDes 242 and Rx SerDes 244 of pluggable line card 204 may be configured for time-domain transmissometry (TDT). Generally, a TDT may measure a transmitted signal response. In contrast, time-domain reflectometry may measure a reflected signal response. As used herein, TDT may refer to instances where one or more equalization techniques are performed by a Tx SerDes. For instance, in an exemplary TDT process, Tx SerDes 252 may provide pre-emphasis (e.g., apply a HPF, apply FFE CTLE, etc.) to a signal output for transmission. Said differently, Tx SerDes 252 may perform equalization for outputting signals for TDT. In the exemplary TDT process, Rx SerDes 244 may apply CTLE (e.g., DLE CTLE) to a signal received from Tx SerDes 252. Although providing TDT is discussed above with Tx SerDes 252 and Rx SerDes 244, Tx SerDes 242 and Rx SerDes 254 may be configured to perform one or more techniques for providing TDT.

Tx SerDes 252 and Rx SerDes 254 of pluggable fabric card 206 and Tx SerDes 242 and Rx SerDes 244 of pluggable line card 204 may be configured for quasi-TDT. As used herein, quasi-TDT may refer to instances where one or more equalization techniques of a traditional or "pure" TDT may be omitted. For instance, in an exemplary quasi-TDT process, Tx SerDes 252 may refrain from providing pre-emphasis (e.g., applying a HPF, applying FFE CTLE, etc.) to a signal output for transmission. Said differently, Tx SerDes 252 may omit equalization for outputting signals for quasi-TDT. In the exemplary quasi-TDT process, Rx SerDes 244 may apply CTLE (e.g., DLE CTLE) to a signal received from Tx SerDes 252. Although providing quasi-TDT is discussed above with Tx SerDes 252 and Rx SerDes 244, Tx SerDes 242 and Rx SerDes 254 may be configured to perform one or more techniques for providing quasi-TDT.

Processor 250 of pluggable fabric card 206 receives a downstream electrical signal from photonics 256, where photonics 256 converts the optical signal from network 236 via optical link 230 into the electrical signal. In this example, the downstream optical signal is modulated in accordance with the PM-QAM (e.g., PM-QPSK) modulation scheme. Photonics 256 converts the downstream optical signal into two pairs of I and Q optical data streams, and converts the two pairs of I and Q optical data streams to two pairs of I and Q electrical data streams (referred to as pairs of I/Q electrical data streams for ease of reference). In this example, the pairs of I/Q electrical data streams together represent magnitude and phase information for the received signal.

Processor 250 may perform additional signal processing on the I/Q electrical data streams to generate a differential electrical data stream that Tx SerDes 252 transmits to pluggable interface 215 via the electrical path provided by traces 225A-N (collectively, traces 225) and a mating of pluggable interface 213 to pluggable interface 215. The differential electrical data stream that Tx SerDes 252 outputs may be a differential non-return-to-zero level (NRZL) data, but other types may be possible. Each trace of traces 225 may be a differential or single-ended transmission line. For example, pluggable fabric card 206 may include eight pairs of traces 225, assuming differential signals, for sixteen total traces.

A differential transmission line refers to a pair of transmission lines, where a first transmission line carries a first data stream (e.g., NRZL) data, and the second transmission line carries a second data stream (e.g., NRZL) data. The second data stream may be the inverse of the first data stream. In differential transmission, the amplitude of the data stream is effectively the difference between the data streams on the pair of transmission lines.

Backplane 202 receives the electrical data streams at pluggable interface 215 and outputs, via an electrical path provided by traces 216A-N (collectively, traces 216) and a mating of pluggable interface 222 to pluggable interface 221, to pluggable line card 204. Each trace of traces 216 may be a differential or single-ended transmission line. For example, backplane 202 may include eight pairs of traces 216, assuming differential signals, for sixteen total traces.

Rx SerDes 244 receives the electrical data streams from backplane 202, via traces 223A-N (collectively, traces 223). Each trace of traces 223 may be a differential or single-ended transmission line. For example, pluggable line card 204 may include eight pairs of traces 223, assuming differential signals, for sixteen total traces.

In the upstream, Tx SerDes 242 outputs the electrical data streams to Rx SerDes 254 via traces 223 and the electrical path provided by the mating of pluggable interface 221 to pluggable interface 222, traces 216, the mating of pluggable interface 215 to pluggable interface 213, and traces 225. Processor 250 receives the pairs of electrical data streams, and performs modulation to generate pairs of I/Q electrical data streams. Photonics 256 converts the pairs of I/Q electrical data streams into a single optical signal for upstream transmission to network 236 via optical link 230.

As illustrated, pluggable line card 204 includes pluggable interface 221 (e.g., an electrical and physical interface), which mates with pluggable interface 222 of backplane 202. In this example, pluggable fabric card 206 includes pluggable interface 213 (e.g., an electrical and physical interface), which mates with pluggable interface 215 of backplane 202. In this way, pluggable interface 213 of pluggable fabric card 206 couples, via pluggable interface 215, trace 216, and pluggable interface 222, to pluggable interface 221 of pluggable line card 204. With pluggable interface 213 and pluggable interface 215, pluggable fabric card 206 can be selectively coupled to or decoupled from pluggable line card 204.

Pluggable interface 221 of pluggable line card 204 includes connection points 231A-N (collectively referred to as "connection points 231") and pluggable interface 222 includes connection points 232A-N (collectively referred to as "connection points 232"). When pluggable line card 204 couples to backplane 202, connection points 231 mate with corresponding connection points 232 to provide a continuous electrical path for data transmission and reception between pluggable line card 204 and backplane 202. Similarly, pluggable interface 213 of pluggable fabric card 206 includes connection points 233A-N (collectively referred to as "connection points 233") and pluggable interface 215 includes connection points 235A-N (collectively referred to as "connection points 235"). When pluggable fabric card 206 couples to backplane 202, connection points 233 mate with corresponding connection points 235 to provide a continuous electrical path for data transmission and reception between pluggable fabric card 206 and backplane 202. In this way, backplane 202 may provide a continuous electrical path for data transmission and reception between pluggable line card 204 and pluggable fabric card 206.

In this disclosure, the term "differential pair transmission line" (also called signal path) is used to encapsulate the various components between the chip die of processor 240 and processor 250. For instance, a differential pair transmission line may include a connection of the chip die of processor 240 to pluggable line card 204, traces 223, pluggable interface 221, pluggable interface 222, traces 216, pluggable interface 215, pluggable interface 213, traces 225 and a connection of the chip die of processor 250 of pluggable fabric card 206.

Within one or more of traces 216, 223, and 225, there may be one or more vias. As an example, traces 223 may be buried in pluggable line card 204, and therefore, in this example, there are vias on pluggable line card 204 from the output of processor 240 to traces 223 and vias from traces 223 to pluggable interface 221. Pluggable interface 221 may mate with pluggable interface 222 through a connector. As an example, traces 216 may be buried in backplane 202, and therefore, in this example, there are vias on backplane 202 from pluggable interface 222 to pluggable interface 215. In some examples, traces 225 may be buried in pluggable fabric card 206, and therefore, in this example, there are vias on pluggable fabric card 206 from the output of processor 250 to traces 225 and vias from traces 225 to pluggable interface 213.

Coupled to processor 240, there may be a plurality of AC-coupling capacitors that block the DC component from reaching drivers within processor 240. For example, processor 240 may be coupled to an AC-coupling capacitor for each one of traces 223. Similarly, coupled to processor 250, there may be a plurality of AC-coupling capacitors that block the DC component from reaching drivers within processor 250. For example, processor 250 may be coupled to an AC-coupling capacitor for each one of traces 225.

The pluggable design may present further fault positions in an electrical path for pairs of electrical data streams transmitted between pluggable line card 204 and pluggable fabric card 206. For example, a mating of pluggable interface 221 to pluggable interface 222 may result in a less than ideal connection between pluggable line card 204 and backplane 202, referred to as physical impairments of mating pluggable interface 221 to pluggable interface 222. For instance, connection points of pluggable interface 221 and connection points of pluggable interface 222 may not line up perfectly. In another example, a mating of pluggable interface 213 to pluggable interface 215 may result in a less than ideal connection between backplane 202 and pluggable fabric card 206, referred to as physical impairments of mating pluggable interface 213 to pluggable interface 215. For instance, connection points of pluggable interface 213 and connection points of pluggable interface 215 may not line up perfectly.

There may be various other fault positions. For instance, the AC-coupling capacitors may dislodge causing an open-circuit condition. Each trace of the differential line may include an AC-coupling capacitor, and it is possible that only one will disconnect, break, malfunction causing an open-circuit on one of the traces, but the AC-coupling capacitor on the other trace may remain intact. In this case, there may be fault condition on one of the lines and not the other. As another example, a via or both vias on one or both traces may cause a short-circuit if there is an inadvertent connection.

In accordance with one or more techniques, system 200 may be configured for self-detection of a fault along a differential pair transmission line. For example, rather than outputting pairs of electrical data streams, pluggable line card 204 may output an electrical signal generated from an electrical function (e.g., a step signal). Because of a fault on the differential pair transmission line, pluggable fabric card 206 receives an electrical signal that is different than the electrical signal transmitted by the pluggable line card 204. In this example, system 200 may, not only determine that a fault has occurred, but also determine a position of the fault based on an electrical signature indicated by the electrical signal when received by the pluggable fabric card 206.

Examples of an electrical function may include, but are not limited to, a step function or another electrical function. In some examples, the step function repeats at a low frequency. For instance, a step function may have less than 50 digital bit values. In some examples, a step function is direct current (DC) balanced. For instance, the step function has an equal number of digital low values ('0') and digital high values ('1').

Tx SerDes 252 may be configured to output an electrical signal based on a step function. Generally, in some applications, a SerDes system may not permit an outputting of a step function. In some examples, rather than output a step function, Tx SerDes 252 may generate a TDT step function for output to Rx SerDes 244. As used herein, a TDT step function may generally include a low-frequency square wave. Examples of low frequency may include, but are not limited to, periodic waveforms (e.g., square waves) having a cycle that includes more than 40 digital bit values. Examples of square waves may include, but are not limited to, a cycle that includes a set of digital low values ('0') prior to or subsequent to a set of digital high values ('1'), where the set of digital low values ('0') and the set of digital high values ('1') have an equal number of digital values. For instance, a TDT step function may be a square wave, where each cycle of the square wave includes 25 digital low values ('0') followed by 25 digital high values ('1'). In some examples, Tx SerDes 252 may output the TDT step function without applying equalization. For instance, Tx SerDes 252 may output the TDT step function using a quasi-TDT process. Said differently, Tx SerDes 252 may output the TDT step function without providing pre-emphasis (e.g., applying a HPF, applying FFE CTLE, etc.) to the TDT step function. Although outputting an electrical signal based on a step function is discussed above with Tx SerDes 252, Tx SerDes 242 may be configured to perform one or more techniques for outputting an electrical signal based on a step function.

The fault detection may be automatic, or may be initiated by user based on observations of errors in either line card or fabric sides. The criteria that may be used to initiate a search for fault detection maybe cyclic redundancy check (CRC) errors, uncorrectable forward error correction (FEC) errors, packets being dropped, or unusual system performance. There may be other criteria used depending on the configuration of the system in the network. The operations to detect a fault and location of the fault may be triggered by a sudden change in the bit error rate or may be a preprogrammed check that occurs on a periodic basis. For example, in response to processor 250 of pluggable fabric card 206 determining that a bit error rate exceeds a threshold, processor 250 may initiate one or more techniques described herein for detecting a position of a fault. In some examples, in response to receiving, from processor 260, via network 236, an indication that a bit error rate exceeds a threshold, processor 250 of pluggable fabric card 206 may initiate one or more techniques described herein for detecting a position of a fault. Similarly, in response to processor 240 of pluggable line card 204 determining that a bit error rate exceeds a threshold, processor 240 may initiate one or more techniques described herein for detecting a position of a fault.

In a downstream operation, in response to the trigger to perform the fault detection and fault detection location, Tx SerDes 252 of processor 250 may output an electrical signal generated from an electrical function. For instance, Tx SerDes 252 may generate a TDT step function for output to Rx SerDes 244, where Tx SerDes 252 and Rx SerDes 244 are configured for quasi-TDT. In some instances, Tx SerDes 252 may generate a TDT step function for output to Rx SerDes 244, where Tx SerDes 252 and Rx SerDes 244 are configured for TDT. A fault along a differential pair transmission line causes a received electrical signal to be different than the transmitted signal. Rx SerDes 244 of processor 240 may convert the received electrical signal into a received digital signal.

Processor 240 may determine an electrical signature of the received electrical signal from the received digital electrical signal when the received electrical signal is received by the receiving electronic device. For example, processor 240 may identify one or more electrical characteristics of the received electrical signal from the received digital electrical signal. For instance, processor 240 may identify a time constant for the received signal. As used herein, a time constant for the received signal may refer to a measure of a rise or fall time of an edge in the receiving electrical signal. In some examples, processor 240 may identify an amount of power of the received signal. It should be understood that although the foregoing discusses processor 240 as determining the electrical signature, other processors, for instance, processor 250 and/or processor 260 may determine the electrical signature.

In an upstream operation, Tx SerDes 242 of processor 240 may output an electrical signal generated from an electrical function. For instance, Tx SerDes 242 may generate a TDT step function for output to Rx SerDes 254, where Tx SerDes 242 and Rx SerDes 254 are configured for quasi-TDT. In some instances, Tx SerDes 242 may generate a TDT step function for output to Rx SerDes 254, where Tx SerDes 242 and Rx SerDes 254 are configured for TDT. Rx SerDes 254 of processor 250 may convert the received electrical signal into a received digital signal. Processor 250 may identify one or more electrical characteristics of the received electrical signal from the received digital electrical signal. For instance, processor 250 may identify a time constant for the received signal. In some examples, processor 250 may identify an amount of power of the received signal. It should be understood that although the foregoing discusses processor 250 as determining the electrical signature, other processors, for instance, processor 240 and/or processor 260 may determine the electrical signature.

Upon determining the electrical signature of the received electrical signal, processor 240 of pluggable line card 204 may determine a position of a fault. For example, processor 240 may determine a position of the fault based on the electrical signature of the received electrical signal. For instance, in response to determining that a power of the received signal satisfies a threshold, processor 240 may determine that the fault has occurred at pluggable interface 221 of pluggable line card 204. In some examples, processor 250 of pluggable fabric card 206 may determine a position of the fault based on the electrical signature of the received electrical signal. In some examples, processor 260 at network 236 may determine a position of the fault based on the electrical signature of the received electrical signal. In some examples, another processor, for instance, configured to communicate with pluggable line card 204 and/or pluggable fabric card 206, may determine the position of the fault based on the electrical signature of the received electrical signal.

In some examples, remote device 261 may determine an electrical signature of the received electrical signal from the received digital signal. For example, processor 260 of remote device 261 may remotely access, via network 236, the received digital signal received by Rx SerDes 244. In some examples, processor 260 may remotely access, via network 236, the received digital signal received by Rx SerDes 254. In any case, processor 260 may determine the an electrical signature of the received electrical signal from the received digital signal. Examples of processor 260 may include, but are not limited to, a digital signal processor (DSP), a general purpose microprocessor, an application specific integrated circuit (ASIC), a field programmable logic array (FPGA), a combination thereof, or other equivalent integrated or discrete logic circuitry.

During a testing phase, processor 260 may store information identifying different electrical signatures based on different faults. For example, a technician may cause different faults on the differential pair transmission line. The technician may indicate the type and location of the fault, and cause processor 240 to output a step function. Rx SerDes 254 converts the received electrical signal into a received digital electrical signal and outputs the received digital electrical signal to processor 260 via network 236. Processor 260 may receive the received digital electrical signal and determine an electrical signature (e.g., rise/fall time, signal power, etc.) of the received digital electrical signal. The technician may then associate the electrical signature with the fault type and location, and repeat for different fault types and different locations. The result may be a database of mappings of electrical signatures and fault types and locations. The database may be then stored in local memory of processor 250 and/or processor 240. During operation, based on the determined electrical signature, processor 240, processor 250, or processor 260 may determine the fault type and location.

Processor 260 may, prior to determining the electrical signature of the received electrical signal, determine an electrical signature for various fault positions of a differential pair transmission line. For example, a technician may create a fault at a positive 'P' channel of the first differential pair transmission line. In this example, processor 260 may identify a first electrical signature corresponding to the fault at a positive 'P' channel of the first differential pair transmission line based on a received digital signal transmitted on the first differential pair transmission line having the fault at a positive 'P' channel. In this example, the technician may create a fault at a negative 'N' channel of the second differential pair transmission line. In this example, processor 260 may identify a second electrical signature based on a received digital signal transmitted on the second differential pair transmission line having the fault at a negative 'N' channel. In this way, processor 260 may determine one or more electrical signatures at each fault position of a differential pair transmission line.

Processor 260 may, prior to determining the electrical signature of the received electrical signal, determine an electrical signature for differential pair transmission line having different lengths. For example, a technician may create a fault at a positive 'P' channel of the first differential pair transmission line having a first length. In this example, processor 260 may identify a first electrical signature corresponding to the fault at the positive 'P' channel of the first differential pair transmission line having the first length based on a received digital signal transmitted on the first differential pair transmission line having the first length. In this example, the technician may create a fault at the positive 'P' channel of a second differential pair transmission line having a second length. In this example, processor 260 may identify a second electrical signature based on a received digital signal transmitted on the second differential pair transmission line having the second length. In this way, processor 260 may determine one or more electrical signatures for differential pair transmission lines having different lengths.

Processor 260 may, prior to determining the electrical signature of the received electrical signal, determine an electrical signature for a differential pair transmission line at different temperatures. For example, a technician may create a fault at a positive 'P' channel of the differential pair transmission line at a first temperature, where pluggable line card 204 and/or pluggable fabric card 206 operate at the first temperature. In this example, processor 260 may identify a first electrical signature corresponding to the fault at the positive 'P' channel of the differential pair transmission line at the first temperatures based on a received digital signal transmitted on the differential pair transmission line at the first temperature. In this example, the technician may create a fault at the positive 'P' channel of the differential pair transmission line at a second temperature, where pluggable line card 204 and/or pluggable fabric card 206 operate at the second temperature. In this example, processor 260 may identify a second electrical signature based on a received digital signal transmitted on the differential pair transmission line at the second temperatures. In this way, processor 260 may determine one or more electrical signatures for a differential pair transmission line at different temperatures.

Processor 260 may, prior to determining the electrical signature of the received electrical signal, determine an electrical signature at a differential pair transmission line for operating pluggable line card 204 and/or pluggable fabric card 206 at different software versions. For example, a technician may create a fault at a positive 'P' channel of the differential pair transmission line, where pluggable line card 204 and/or pluggable fabric card 206 operate at a first software version. In this example, processor 260 may identify a first electrical signature corresponding to the fault at the positive 'P' channel of the differential pair transmission line for operating pluggable line card 204 and/or pluggable fabric card 206 at the first software version. In this example, the technician may create a fault at the positive 'P' channel of the differential pair transmission line for operating pluggable line card 204 and/or pluggable fabric card 206 at a second software version. In this example, processor 260 may identify a second electrical signature based on a received digital signal transmitted on the differential pair transmission line for operating pluggable line card 204 and/or pluggable fabric card 206 at the second software version. In this way, processor 260 may determine one or more electrical signatures for the differential pair transmission lines for operating pluggable line card 204 and/or pluggable fabric card 206 at different software versions.

Processor 260 may, prior to determining the electrical signature of the received electrical signal, determine an electrical signature at a differential pair transmission line for operating different hardware versions of pluggable line card 204 and/or pluggable fabric card 206. For example, a technician may create a fault at a positive 'P' channel of a differential pair transmission line, where pluggable line card 204 and/or pluggable fabric card 206 are associated with a first production or model number. In this example, processor 260 may identify a first electrical signature corresponding to the fault at the positive 'P' channel of the differential pair transmission line for the first production or model number of pluggable line card 204 and/or pluggable fabric card 206. In this example, the technician may create a fault at the positive 'P' channel of the differential pair transmission line, where pluggable line card 204 and/or pluggable fabric card 206 are associated with a second production or model number. In this example, processor 260 may identify a second electrical signature based on a received digital signal transmitted on the differential pair transmission line for operating pluggable line card 204 and/or pluggable fabric card 206 at the second software version. In this way, processor 260 may determine one or more electrical signatures for different hardware versions of pluggable line card 204 and/or pluggable fabric card 206.

As described above, processor 260 may form a database relating the electrical signatures and faults. One example way is based on statistical data. For example, processor 260 may generate statistical data for each link of an eye diagram. As used herein, a link of an eye diagram may refer to a range of voltages of an eye diagram for a particular parameter, e.g., a length of differential pair transmission line. Examples of statistical data may include, but are not limited to, a min, a max, a range, a 1, 2, 3-sigma, an eye diagram stat, or other statistical data. As used herein, an eye diagram may refer to an output of pluggable line card 204 and/or pluggable fabric card 206 at various bit sequences superimposed over one another. Examples of an eye diagram stat may include, but are not limited to, a bit error rate (BER), a receiving parameter, a correctable error, and other eye diagram stats. In some examples, statistical information may be used to identify outliers in data. For instance, processor 260 may use a mean and standard distribution of eye diagram statistical data may to identify outliers in the eye diagram statistical data for waveforms for an open positive 'P' channel and an open negative 'N' channel at both transmitting and receiving sides. More specifically, in some instances, processor 260 may identify values having a standard deviation of more than 2.5 outliers. In some examples, processor 260 may determine that a fault has occurred when identifying outliers. Further, in some examples, a type of outlier may indicate a position of the fault. For instance, processor 260 may determine that a fault is positioned at a positive 'P' channel of a differential pair transmission line a fault when the eye diagram for the differential pair transmission line indicates an outlier in a particular pass and/or fail range associated with a fault positioned at the positive 'P' channel of the differential pair transmission line.

Once the database relating the electrical signatures and faults is generated, one or more predetermined electrical signatures of the database may be stored at remote device 261. For example, remote device 261 may be configured to store at a memory an indication that a time constant of less than 0.063 volts per 4 microseconds corresponds to a fault at a receiving electronic device and that a time constant of greater than 0.063 volts per 4 microseconds corresponds to a fault at a transmitting electronic device. Periodically, processor 240 and/or processor 250 may retrieve the one or more predetermined electrical signatures. For instance, processor 250 may request, via network 236, the one or more predetermined electrical signatures and store the one or more predetermined electrical signatures at a memory of pluggable fabric card 206. Additionally, or alternatively, processor 250 may request, via network 236, the one or more predetermined electrical signatures and forward the one or more predetermined electrical signatures to processor 240 for storage at a memory of pluggable line card 204.

Processor 240 may determine a position of a fault on a differential pair transmission line based on a predetermined electrical signature. For example, processor 240 of pluggable line card 204 may determine a position of the fault for a differential pair transmission line formed by one or more components of pluggable line card 204, backplane 202, and pluggable fabric card 206 based on a predetermined electrical signature. For instance, processor 240 of pluggable line card 204 may determine that a position of the fault for the differential pair transmission line formed by one or more components of pluggable line card 204, backplane 202, and pluggable fabric card 206 is at the positive 'P' channel when an electrical signature of the received electrical signal corresponds to (e.g., matches) a predetermined electrical signature for a fault positioned at the positive 'P' channel. In some examples, processor 250 of pluggable fabric card 206 may determine a position of the fault for a differential pair transmission line formed by one or more components of pluggable line card 204, backplane 202, and pluggable fabric card 206 based on a predetermined electrical signature. In some examples, processor 260 at network 236 may determine a position of the fault for a differential pair transmission line formed by one or more components of pluggable line card 204, backplane 202, and pluggable fabric card 206 based on a predetermined electrical signature. In some examples, another processor, for instance, configured to communicate with pluggable line card 204 and/or pluggable fabric card 206, may determine a position of the fault for a differential pair transmission line formed by one or more components of pluggable line card 204, backplane 202, and pluggable fabric card 206 based on a predetermined electrical signature.

According to example downstream implementations of the techniques described in this disclosure, pluggable line card 204 receives, from pluggable fabric card 206 an electrical signal. Rx SerDes 244 converts the received electrical signal into a received digital electrical signal. Processor 240 of pluggable line card 204 determines an electrical signature of the received electrical signal from the received digital electrical signal when the received electrical signal is received by pluggable line card 204. The electrical waveform or signature is determined either through simulation or through measurements or some combination during system development. These electrical signals are then stored in a database and statistics are applied to cover process, voltage and temperature effects. From the database, engineering judgement is applied to create a pass/fail criteria for the different combinations of line card and fabric card slot locations and topologies. During normal system operation, each differential pair location has a measured waveform that can be compared to the pass/fail criteria. If the differential pair fails the electrical signature, then further comparison to the database of electrical signatures can be done to determine a deeper understanding of what is failing and where in the system the fault is occurring. For example, processor 240 may determine the electrical signature. For instance, an integrator circuit of processor 240 integrates the received electrical signal to determine a power for the received electrical signal. In some instances, processor 240 may include a bandpass filter that filters the received electrical signal and processor 240 may determine the electrical signature based on an amplitude of the received electrical signal after filtering by the bandpass filter. In some examples, processor 250 determines the electrical signature. In some examples, processor 260 determines the electrical signature.

Processor 240 of pluggable line card 204 determines, based on the electrical signature, a position of a fault between pluggable line card 204 and pluggable fabric card 206. For example, processor 240 may determine that a position of the fault for the differential pair transmission line is at a positive 'P' channel when an electrical signature of the received electrical signal corresponds to (e.g., matches) a predetermined electrical signature for a fault positioned at the positive 'P' channel. In some examples, processor 250 determines the electrical signature.

Remote device 261 may determine an electrical signature. For example, processor 260 of remote device 261 may receive from pluggable fabric card 206 an indication of a received digital electrical signal. In this example, processor 260 may determine an electrical characteristic based on the received digital electrical signal. In this example, processor 260 accesses a database at remote device 261 and identifies a predetermined electrical signature that corresponds to the determined electrical characteristics. In this example, processor 260 determines a position of the fault location associated with the electrical signature.

According to example upstream implementations of the techniques described in this disclosure, pluggable fabric card 206 receives, from pluggable line card 204 an electrical signal. Rx SerDes 254 converts the received electrical signal into a received digital electrical signal. Processor 250 of pluggable fabric card 206 determines an electrical signature of the received electrical signal from the received digital electrical signal when the received electrical signal is received by pluggable fabric card 206. For example, processor 250 determines the electrical signature. In some examples, processor 240 determines the electrical signature. In some examples, processor 260 determines the electrical signature.

Processor 250 determines, based on the electrical signature, a position of a fault between pluggable line card 204 and pluggable fabric card 206. For example, processor 250 of pluggable fabric card 206 may determine that a position of the fault for the differential pair transmission line is at a negative 'N' channel when an electrical signature of the received electrical signal corresponds to (e.g., matches) a predetermined electrical signature for a fault positioned at the negative 'N' channel. In some examples, processor 240 determines the electrical signature. In some examples, processor 260 determines the electrical signature.

FIG. 3 is a block diagram illustrating a first example of a differential pair transmission line 300 connecting a receiving electronic device 346 and a transmitting electronic device 340, in accordance with one or more examples described in this disclosure. As shown, FIG. 3 includes a transmitting electronic device 340, trace 342, capacitor 344, and receiving electronic device 346. FIG. 3 is discussed with reference to FIGS. 1-2 for exemplary purposes only.

Transmitting electronic device 340 may be configured to output a signal for transmission using trace 342. In some examples, transmitting electronic device 340 is an example of processor 240 of FIG. 2. In some examples, transmitting electronic device 340 is an example of processor 250 of FIG. 2.

Trace 342 may be configured to form a differential pair transmission line for conducting an electrical signal. In some examples, trace 342 may be a single trace of traces 216 of FIG. 2. For instance, trace 342 may be trace 216A of FIG. 2. In some examples, trace 342 may be a single trace of traces 114 of FIG. 1. For instance, trace 342 may be trace 114A of FIG. 1 arranged on backplane 102 of FIG. 1.

Capacitor 344 may be configured to block a DC component from reaching receiving electronic device 346. Capacitor 344 may include an electrical component configured to store electrical energy in an electric field. Examples of an electrical component configured to store electrical energy in an electric field may include, but are not limited to, ceramic capacitors, film capacitors, electrolytic capacitors (e.g., aluminum, tantalum, niobium, or the like), super capacitors (e.g., double layer, pseudocapacitors, hybrid capacitors), mica capacitors, or the like. Although capacitor 344 may be described as a single capacitor, capacitor 344 may be an array of capacitive elements. For instance, capacitor 344 may be an array of capacitive elements coupled in parallel and/or series. In some instances, each capacitive element may be a discrete component, while in other instances, each one of the capacitive elements may be contained within a single package (e.g., capacitor array).

Receiving electronic device 346 may be a device that outputs a signal for transmission using trace 342. In some examples, receiving electronic device 346 is an example of processor 240 of FIG. 2. In some examples, receiving electronic device 346 is an example of processor 250 of FIG. 2.

In an example techniques described in this disclosure, during a testing phase, a technician may disconnect one channel (e.g., positive channel 'P' or negative channel 'N') of trace 342 from capacitor 344 and cause transmitting electronic device 340 to output a step function. Receiving electronic device 346 may receive the electrical signal and determine an electrical signature (e.g., rise/fall time, signal power, etc.) of the received electrical signal. The technician may then associate the electrical signature with one channel of trace 342 being disconnected from capacitor 344. Similarly, the technician may disconnect one channel (e.g., positive channel 'P' or negative channel 'N') of trace 342 from transmitting electronic device 340 and cause transmitting electronic device 340 to output a step function. Receiving electronic device 346 may receive the electrical signal and determine an electrical signature (e.g., rise/fall time, signal power, etc.) of the received electrical signal. The technician may then associate the electrical signature with one channel of trace 342 being disconnected from transmitting electronic device 340.

During a testing phase, the technician may remove capacitor 344 and cause transmitting electronic device 340 to output a step function. Receiving electronic device 346 may receive the electrical signal and determine an electrical signature (e.g., rise/fall time, signal power, etc.) of the received electrical signal. The technician may then associate the electrical signature with a removed capacitor 344.

After the testing phase, receiving electronic device 346 may determine a position of a fault relative to trace 342. For example, receiving electronic device 346 may determine a position of the fault relative to trace 342 based on the electrical signature of the received electrical signal. For instance, receiving electronic device 346 may determine that a position of the fault is between receiving electronic device 346 and trace 342 when an electrical signature of the received electrical signal corresponds to (e.g., matches) the electrical signature associated by the technician as one channel of trace 342 being disconnected from capacitor 344. In another instance, receiving electronic device 346 may determine that a position of the fault is between transmitting electronic device 340 and trace 342 when an electrical signature of the received electrical signal corresponds to (e.g., matches) the electrical signature with one channel of trace 342 being disconnected from transmitting electronic device 340. In some examples, another processor, for instance, processor 260 of FIG. 2 may determine a position of the fault relative to trace 342 based on the electrical signature of the received electrical signal.

Receiving electronic device 346 may determine a position of a fault relative to capacitor 344. For example, receiving electronic device 346 may determine a position of the fault relative to capacitor 344 based on the electrical signature of the received electrical signal. For instance, receiving electronic device 346 may determine that a position of the fault is at capacitor 344 (e.g., capacitor 344 is disconnected from trace 342 and/or from receiving electronic device 346) when an electrical signature of the received electrical signal corresponds to (e.g., matches) a predetermined electrical signature for a fault at capacitor 344. In some examples, another processor, for instance, processor 260 of FIG. 2 may determine a position of the fault relative to capacitor 344 based on the electrical signature of the received electrical signal.

According to example implementations of the techniques described in this disclosure, receiving electronic device 346 receives, from transmitting electronic device 340 an electrical signal. Receiving electronic device 346 converts the received electrical signal into a received digital electrical signal. Receiving electronic device 346 determines an electrical signature of the received electrical signal from the received digital electrical signal when the received electrical signal is received by the receiving electronic device. In some examples, transmitting electronic device 340 determines the electrical signature. Receiving electronic device 346 determines, based on the electrical signature, a position of a fault between transmitting electronic device 340 and receiving electronic device 346. For example, receiving electronic device 346 may determine that a position of the fault is between receiving electronic device 346 and trace 342 when an electrical signature of the received electrical signal corresponds to a predetermined electrical signature for a fault positioned between receiving electronic device 346 and trace 342. In another example, receiving electronic device 346 may determine that a position of the fault is at capacitor 344 when an electrical signature of the received electrical signal corresponds to a predetermined electrical signature for a fault at capacitor 344.

FIG. 4 is a block diagram illustrating a second example of a differential pair transmission line 400 connecting a receiving electronic device 446 and a transmitting electronic device 440, in accordance with one or more examples described in this disclosure. As shown, FIG. 4 includes a transmitting electronic device 440, socket 450, trace 451, connector 441, trace 442, connector 443, capacitor 444, trace 457, socket 456, and receiving electronic device 446. FIG. 4 is discussed with reference to FIGS. 1-3 for exemplary purposes only.

Transmitting electronic device 440 may be configured to output a signal for transmission using trace 442. In some examples, transmitting electronic device 440 is an example of processor 240 of FIG. 2. In some examples, transmitting electronic device 440 is an example of processor 250 of FIG. 2.

Socket 450 may be configured to provide mechanical and electrical connections between transmitting electronic device 440 and receiving electronic device 446. For instance, socket 450 may include a connection point for each positive 'P' channel and each negative 'N' channel of a differential pair transmission line. In some examples, socket 450 may include connection points for multiple differential pair transmission lines. For instance, socket 450 may include connection points for more than 100 differential pair transmission lines.

Trace 451 may be configured to form a portion of differential pair transmission line 400 for conducting an electrical signal from socket 450 to connector 441. For example, trace 451 be an example of one or more of traces 223 of FIG. 2. For instance, trace 451 may be an example of trace 223A of FIG. 2 for a positive 'P' channel and trace 223B of FIG. 2 for a negative 'N' channel of differential pair transmission line 400. In some examples, trace 451 may be an example of one or more of traces 225 of FIG. 2. For instance, trace 451 may be an example of trace 225A of FIG. 2 for a positive 'P' channel and trace 225B of FIG. 2 for a negative 'N' channel of differential pair transmission line 400.

Connector 441 may be configured to provide a pluggable connection between trace 451 and trace 442. Connector 441 may be an example of a mating of pluggable interfaces 213 and 215 of FIG. 2. In some examples, connector 441 may be an example of a mating of pluggable interfaces 213 and 215 of FIG. 2. For instance, connector 441 may include multiple connection points for differential pair transmission line 400.

Trace 442 may be configured to form a differential pair transmission line for conducting an electrical signal. In some examples, trace 442 may be a single trace of traces 216 of FIG. 2. For instance, trace 442 may be trace 216A of FIG. 2. In some examples, trace 442 may be a single trace of traces 114 of FIG. 1. For instance, trace 442 may be trace 114A of FIG. 1 arranged on backplane 102 of FIG. 1.

Connector 443 may be configured to provide a pluggable connection between trace 442 and trace 457. Connector 443 may be an example of a mating of pluggable interfaces 213 and 215 of FIG. 2. In some examples, connector 443 may be an example of a mating of pluggable interfaces 213 and 215 of FIG. 2. For instance, connector 441 may include multiple connection points for differential pair transmission line 400.

Trace 457 may be configured to form a portion of differential pair transmission line 400 for conducting an electrical signal from socket connector 443 to capacitor 444 and socket 456. For example, trace 457 may be an example of one or more traces of traces 223 of FIG. 2. For instance, trace 457 may be trace 223A of FIG. 2 for a positive 'P' channel and trace 223B of FIG. 2 for a negative 'N' channel of differential pair transmission line 400. In some examples, trace 457 may be an example of one or more traces of traces 225 of FIG. 2. For instance, trace 457 may be trace 225A of FIG. 2 for a positive 'P' channel and trace 225B of FIG. 2 for a negative 'N' channel of differential pair transmission line 400.

Capacitor 444 may be configured to block a DC component from reaching receiving electronic device 446. Capacitor 444 may include an electrical component configured to store electrical energy in an electric field. Although capacitor 444 may be described as a single capacitor, capacitor 444 may be an array of capacitive elements. For instance, capacitor 444 may be an array of capacitive elements coupled in parallel and/or series. In some instances, each capacitive element may be a discrete component, while in other instances, each one of the capacitive elements may be contained within a single package (e.g., capacitor array).

Socket 456 may be configured to provide mechanical and electrical connections between trace 457 and receiving electronic device 446. For instance, socket 465 may include a connection point for each positive 'P' channel and each negative 'N' channel of differential pair transmission line 400. In some examples, socket 456 may include connection points for multiple differential pair transmission lines. For instance, socket 456 may include connection points for more than 100 differential pair transmission lines.

Receiving electronic device 446 may be a device that outputs a signal for transmission using trace 442. In some examples, receiving electronic device 446 is an example of processor 240 of FIG. 2. In some examples, receiving electronic device 446 is an example of processor 250 of FIG. 2.

In an example techniques described in this disclosure, during a testing phase, a technician may cause a fault at one channel (e.g., positive channel 'P' or negative channel 'N') at socket 450 and cause transmitting electronic device 440 to output a step function. Receiving electronic device 446 may receive the electrical signal and determine an electrical signature (e.g., rise/fall time, signal power, etc.) of the received electrical signal. The technician may then associate the electrical signature with a fault at one channel at socket 450. Similarly, during a testing phase, a technician may cause a fault at one channel (e.g., positive channel 'P' or negative channel 'N') and between transmitting electronic device 440 and socket 450 and cause transmitting electronic device 440 to output a step function. Receiving electronic device 446 may receive the electrical signal and determine an electrical signature (e.g., rise/fall time, signal power, etc.) of the received electrical signal. The technician may then associate the electrical signature with a fault at one channel between transmitting electronic device 440 and socket 450.

During a testing phase, the technician may cause a fault at one channel (e.g., positive channel 'P' or negative channel 'N') at connector 441 and cause transmitting electronic device 440 to output a step function. Receiving electronic device 446 may receive the electrical signal and determine an electrical signature (e.g., rise/fall time, signal power, etc.) of the received electrical signal. The technician may then associate the electrical signature with a fault at one channel at connector 441.

During a testing phase, the technician may cause a fault at one channel (e.g., positive channel 'P' or negative channel 'N') at connector 443 and cause transmitting electronic device 440 to output a step function. Receiving electronic device 446 may receive the electrical signal and determine an electrical signature (e.g., rise/fall time, signal power, etc.) of the received electrical signal. The technician may then associate the electrical signature with a fault at one channel at connector 443.

During a testing phase, a technician may cause a fault at capacitor 444 and cause transmitting electronic device 440 to output a step function. Receiving electronic device 446 may receive the electrical signal and determine an electrical signature (e.g., rise/fall time, signal power, etc.) of the received electrical signal. The technician may then associate the electrical signature with a fault at capacitor 444. Similarly, a technician may cause a between capacitor 444 and receiving electronic device 446 and cause transmitting electronic device 440 to output a step function. Receiving electronic device 446 may receive the electrical signal and determine an electrical signature (e.g., rise/fall time, signal power, etc.) of the received electrical signal. The technician may then associate the electrical signature with a fault between capacitor 444 and receiving electronic device 446.

In an example techniques described in this disclosure, during a testing phase, a technician may cause a fault at one channel (e.g., positive channel 'P' or negative channel 'N') at socket 456 and cause transmitting electronic device 440 to output a step function. Receiving electronic device 446 may receive the electrical signal and determine an electrical signature (e.g., rise/fall time, signal power, etc.) of the received electrical signal. The technician may then associate the electrical signature with a fault at one channel at socket 456. Similarly, during a testing phase, a technician may cause a fault at one channel (e.g., positive channel 'P' or negative channel 'N') and between receiving electronic device 446 and socket 456 and cause transmitting electronic device 440 to output a step function. Receiving electronic device 446 may receive the electrical signal and determine an electrical signature (e.g., rise/fall time, signal power, etc.) of the received electrical signal. The technician may then associate the electrical signature with a fault at one channel between receiving electronic device 446 and socket 456.

After the testing phase, receiving electronic device 446 may determine a position of a fault relative to socket 450. For example, receiving electronic device 446 may determine a position of the fault relative to relative to socket 450 based on the electrical signature of the received electrical signal. For instance, receiving electronic device 446 may determine that a position of the fault is between transmitting electronic device 440 and socket 450 when an electrical signature of the received electrical signal corresponds to (e.g., matches) the electrical signature associated with the fault at one channel between transmitting electronic device 440 and socket 450. In another instance, receiving electronic device 446 may determine that a position of the fault is at socket 450 when an electrical signature of the received electrical signal corresponds to (e.g., matches) the electrical signature associated with the fault at one channel at socket 450. In some examples, another processor, for instance, processor 260 of FIG. 2 may determine a position of the fault relative to socket 450 based on the electrical signature of the received electrical signal.

Receiving electronic device 446 may determine a position of a fault relative to connector 441. For example, receiving electronic device 446 may determine a position of the fault relative to relative to connector 441 based on the electrical signature of the received electrical signal. For instance, receiving electronic device 446 may determine that a position of the fault is between transmitting electronic device 440 and connector 441 when an electrical signature of the received electrical signal corresponds to (e.g., matches) the electrical signature associated with a fault at one channel at connector 441. In another instance, receiving electronic device 446 may determine that a position of the fault is at connector 441 when an electrical signature of the received electrical signal corresponds to (e.g., matches) the electrical signature associated with a fault at one channel at connector 441. In some examples, another processor, for instance, processor 260 of FIG. 2 may determine a position of the fault relative to connector 441 based on the electrical signature of the received electrical signal.

Receiving electronic device 446 may determine a position of a fault relative to connector 443. For example, receiving electronic device 346 may determine a position of the fault relative to relative to connector 443 based on the electrical signature of the received electrical signal. For instance, receiving electronic device 446 may determine that a position of the fault is between receiving electronic device 446 and connector 443 when an electrical signature of the received electrical signal corresponds to (e.g., matches) the electrical signature associated with a fault at one channel at connector 443. In another instance, receiving electronic device 346 may determine that a position of the fault is at connector 443 when an electrical signature of the received electrical signal corresponds to (e.g., matches) the electrical signature associated with a fault at one channel at connector 443. In some examples, another processor, for instance, processor 260 of FIG. 2 may determine a position of the fault relative to connector 443 based on the electrical signature of the received electrical signal.

Receiving electronic device 446 may determine a position of a fault relative to capacitor 444. For example, receiving electronic device 446 may determine a position of the fault relative to relative to capacitor 444 based on the electrical signature of the received electrical signal. For instance, receiving electronic device 446 may determine that a position of the fault is between receiving electronic device 446 and capacitor 444 when an electrical signature of the received electrical signal corresponds to (e.g., matches) the electrical signature associated with a fault between receiving electronic device 446 and capacitor 444. In another instance, receiving electronic device 446 may determine that a position of the fault is at capacitor 444 when an electrical signature of the received electrical signal corresponds to (e.g., matches) the electrical signature associated with a fault at capacitor 444. In some examples, another processor, for instance, processor 260 of FIG. 2 may determine a position of the fault relative to capacitor 444 based on the electrical signature of the received electrical signal.

Receiving electronic device 446 may determine a position of a fault relative to socket 456. For example, receiving electronic device 446 may determine a position of the fault relative to relative to socket 456 based on the electrical signature of the received electrical signal. For instance, receiving electronic device 446 may determine that a position of the fault is between receiving electronic device 446 and socket 456 when an electrical signature of the received electrical signal corresponds to (e.g., matches) the electrical signature associated with the fault at one channel between receiving electronic device 446 and socket 456. In another instance, receiving electronic device 446 may determine that a position of the fault is at socket 456 when an electrical signature of the received electrical signal corresponds to (e.g., matches) the electrical signature associated with the fault at one channel at socket 450. In some examples, another processor, for instance, processor 260 of FIG. 2 may determine a position of the fault relative to socket 456 based on the electrical signature of the received electrical signal.

According to example implementations of the techniques described in this disclosure, receiving electronic device 446 receives, from transmitting electronic device 440 an electrical signal. Receiving electronic device 446 converts the received electrical signal into a received digital electrical signal. Receiving electronic device 446 determines an electrical signature of the received electrical signal from the received digital electrical signal when the received electrical signal is received by the receiving electronic device. For example, receiving electronic device 446 determines the electrical signature. In some examples, transmitting electronic device 440 determines the electrical signature. Receiving electronic device 446 determines, based on the electrical signature, a position of a fault between transmitting electronic device 440 and receiving electronic device 446. For example, receiving electronic device 446 may determine a position of the fault when an electrical signature of the received electrical signal corresponds to (e.g., matches) a predetermined electrical signature.

Figure 5:
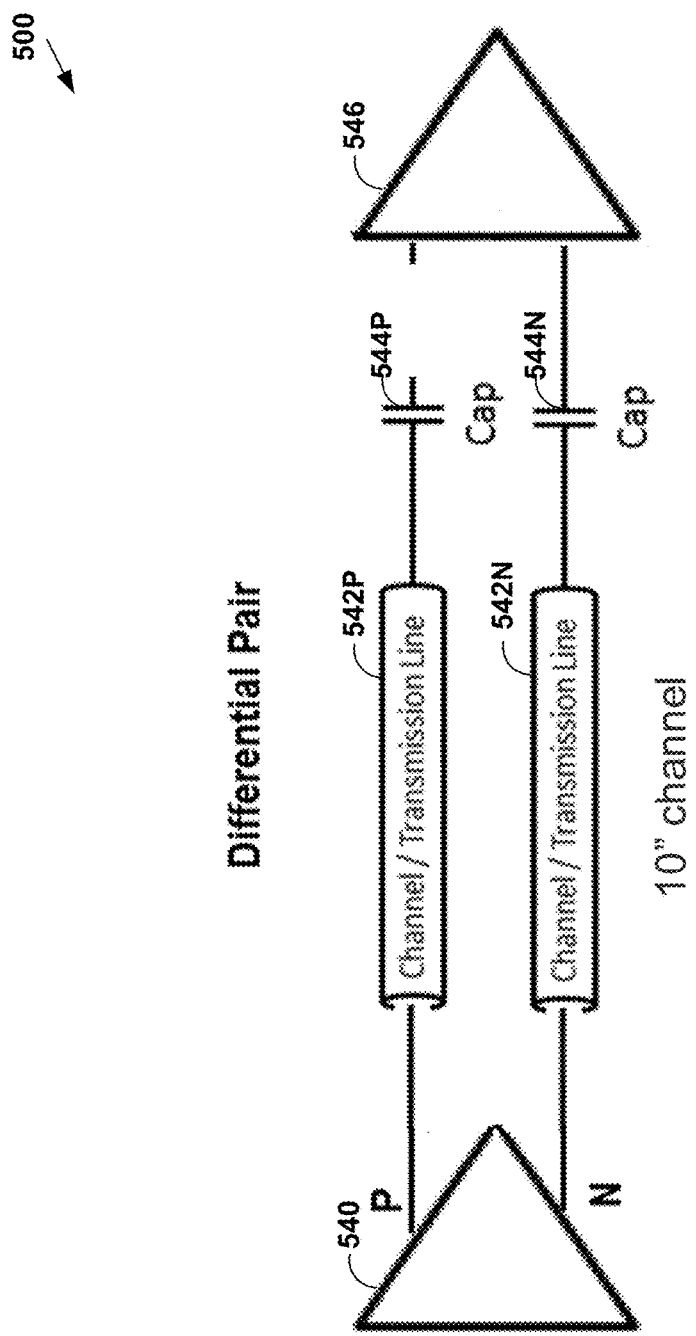
FIG. 5 is an example of a first position of a fault at a positive channel of a receiving electrical device, in accordance with one or more examples described in this disclosure.

FIG. 5 is an example of a first position of a fault at a positive channel of a receiving electrical device, in accordance with one or more examples described in this disclosure. As shown, FIG. 5 includes a transmitting electronic device 540, transmission lines 542P and N, capacitors 544P and N, and receiving electronic device 546. FIG. 5 is discussed with reference to FIGS. 1-4 for exemplary purposes only. Transmitting electronic device 540 may be an example of transmitting electronic device 340 of FIG. 3. Transmission lines 542P may be an example of trace 342 of FIG. 3 and transmission lines 542N may be an example of trace 342 of FIG. 3. Capacitor 544P may be an example of capacitor 344 of FIG. 3 and capacitor 544N may be an example of capacitor 344 of FIG. 3. Receiving electronic device 546 may be an example of receiving electronic device 346 of FIG. 3.

Receiving electronic device 546 may determine whether the fault has occurred between capacitor 544P and receiving electronic device 546. For instance, receiving electronic device 546 may determine that a position of the fault is between receiving electronic device 446 and capacitor 544P when an electrical signature of the received electrical signal corresponds to (e.g., matches) a predetermined electrical signature for a fault positioned between receiving electronic device 446 and capacitor 544P. In some examples, transmitting electronic device 540 may determine whether the fault has occurred between capacitor 544P and receiving electronic device 546. In some examples, another processor, for instance, processor 260 of FIG. 2 may determine whether the fault has occurred between capacitor 544P and receiving electronic device 546.

Figure 6:
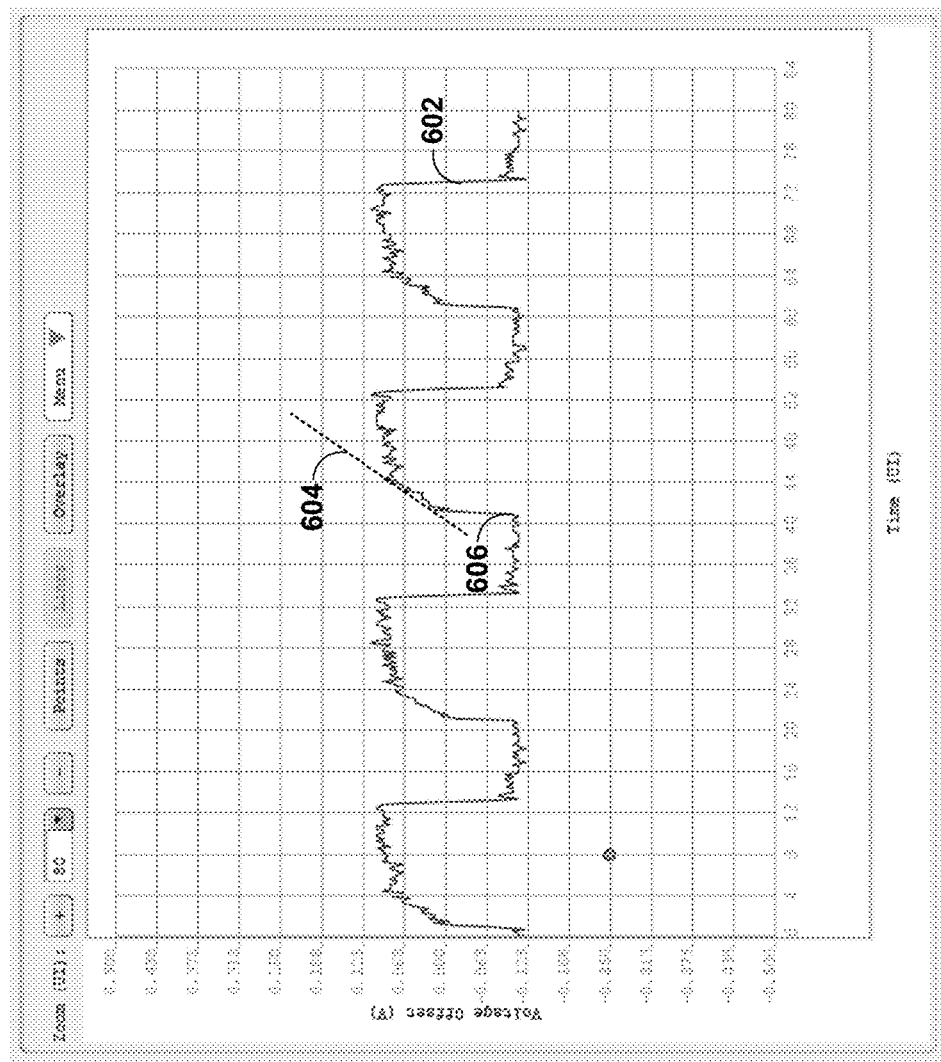
FIG. 6 is an example of a quasi-TDT electrical signature for the fault of FIG. 5, in accordance with one or more examples described in this disclosure.

FIG. 6 is an example of a quasi-TDT electrical signature 602 for the fault of FIG. 5, in accordance with one or more examples described in this disclosure. As shown, quasi-TDT electrical signature 602 includes time constant 604 for a rise time of edge 606 in the quasi-TDT electrical signature 602.

Receiving electronic device 546 of FIG. 5 may determine whether the fault has occurred between capacitor 544P of FIG. 5 and receiving electronic device 546 of FIG. 5. For example, receiving electronic device 546 of FIG. 5 may determine whether the fault has occurred between capacitor 544P of FIG. 5 and receiving electronic device 546 of FIG. 5 based on time constant 604. For instance, in response to determining that time constant 604 satisfies a threshold (e.g., is less than 0.063 volts per 4 microseconds), transmitting electronic device 540 of FIG. 5 may determine that the fault has occurred between capacitor 544P of FIG. 5 and receiving electronic device 546 of FIG. 5. In some examples, receiving electronic device 546 of FIG. 5 may determine whether the fault has occurred between capacitor 544P of FIG. 5 and receiving electronic device 546 of FIG. 5 based on time constant 604. In some examples, another processor, for instance, processor 260 at network 236 may determine whether the fault has occurred between capacitor 544P of FIG. 5 and receiving electronic device 546 of FIG. 5 based on time constant 604.

Figure 7:
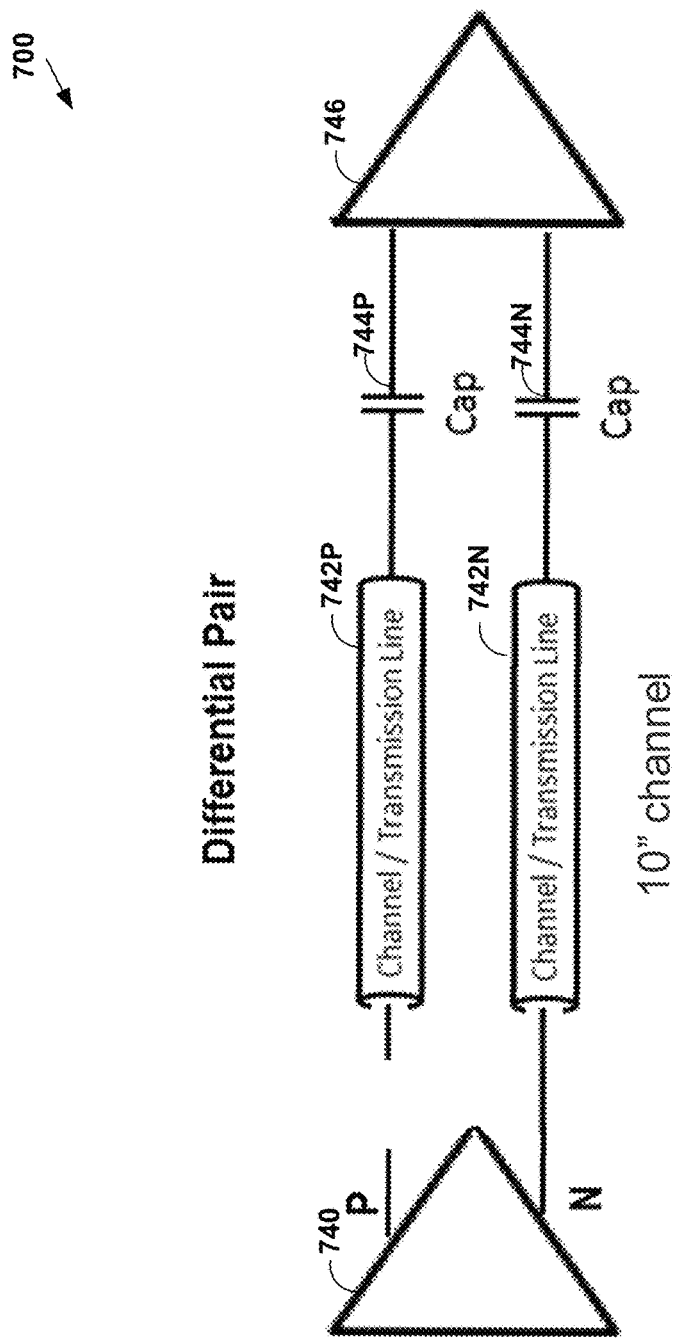
FIG. 7 is an example of a second position of a fault at a positive channel of a transmitting electrical device, in accordance with one or more examples described in this disclosure.

FIG. 7 is an example of a second position of a fault at a positive channel of a transmitting electrical device, in accordance with one or more examples described in this disclosure. As shown, FIG. 7 includes a transmitting electronic device 740, transmission lines 742P and N, capacitors 744P and N, and receiving electronic device 746. FIG. 7 is discussed with reference to FIGS. 1-6 for exemplary purposes only. Transmitting electronic device 740 may be an example of transmitting electronic device 340 of FIG. 3. Transmission lines 742P may be an example of trace 342 of FIG. 3 and transmission lines 742N may be an example of trace 342 of FIG. 3. Capacitor 744P may be an example of capacitor 344 of FIG. 3 and capacitor 744N may be an example of capacitor 344 of FIG. 3. Receiving electronic device 746 may be an example of receiving electronic device 346 of FIG. 3.

Receiving electronic device 746 may determine whether the fault has occurred between transmitting electronic device 740 and transmission line 742P. In some examples, transmitting electronic device 740 may determine whether the fault has occurred between transmitting electronic device 740 and transmission line 742P. In some examples, another processor, for instance, processor 260 of FIG. 2 may determine whether the fault has occurred between transmitting electronic device 740 and transmission line 742P.

Figure 8:
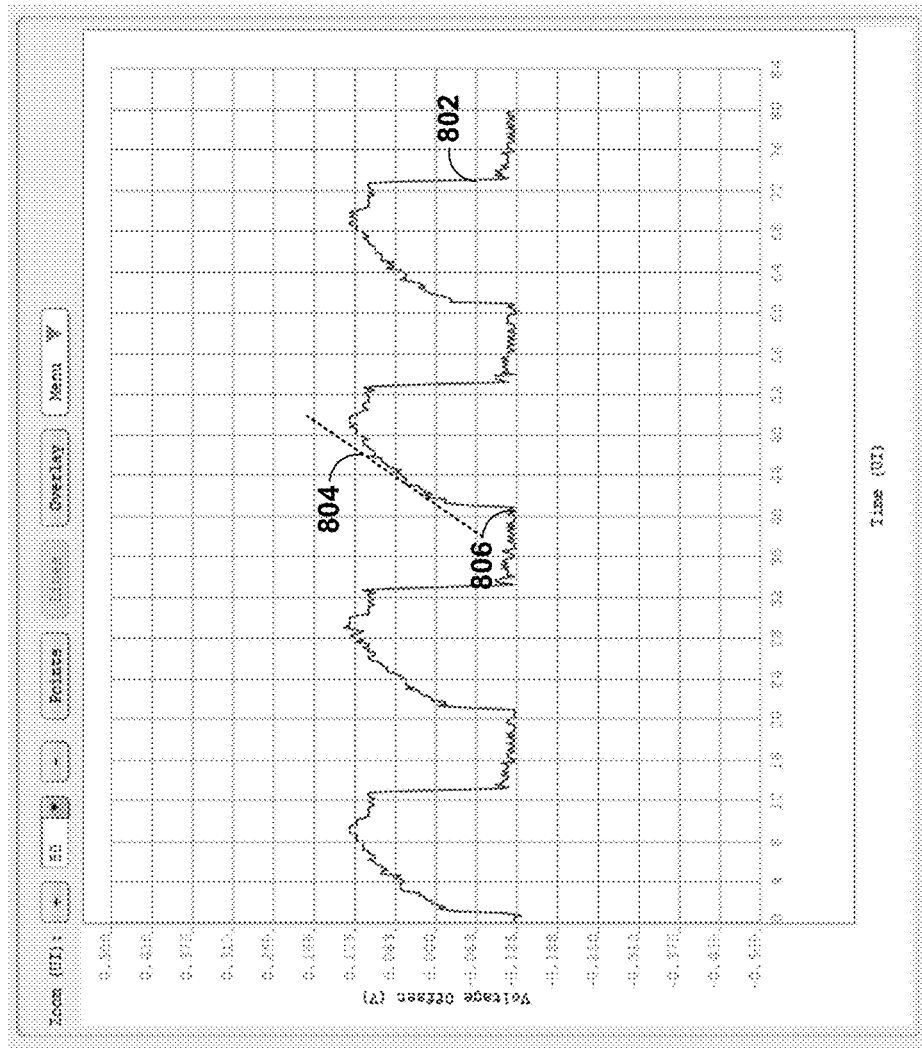
FIG. 8 is an example of a quasi-TDT electrical signature for the fault of FIG. 7, in accordance with one or more examples described in this disclosure.

FIG. 8 is an example of a quasi-TDT electrical signature 802 for the fault of FIG. 7, in accordance with one or more examples described in this disclosure. As shown, quasi-TDT electrical signature 802 includes time constant 804 for a rise time of edge 806 in the quasi-TDT electrical signature 802.

Receiving electronic device 746 of FIG. 7 may determine whether the fault has occurred between transmitting electronic device 740 of FIG. 7 and transmission line 742P of FIG. 7. For example, receiving electronic device 746 of FIG. 7 may determine whether the fault has occurred between transmitting electronic device 740 of FIG. 7 and transmission line 742P of FIG. 7 based on time constant 804. For instance, in response to determining that time constant 804 satisfies a threshold (e.g., is greater than 0.063 volts per 4 microseconds), transmitting electronic device 740 of FIG. 7 may determine that the fault has occurred between transmitting electronic device 740 of FIG. 7 and transmission line 742P of FIG. 7. In some examples, receiving electronic device 746 of FIG. 7 may determine whether the fault has occurred between capacitor 744P of FIG. 7 and receiving electronic device 746 of FIG. 7 based on time constant 804. In some examples, another processor, for instance, processor 260 at network 236 may determine whether the fault has occurred between transmitting electronic device 740 of FIG. 7 and transmission line 742P of FIG. 7 based on time constant 804.

Figure 9:
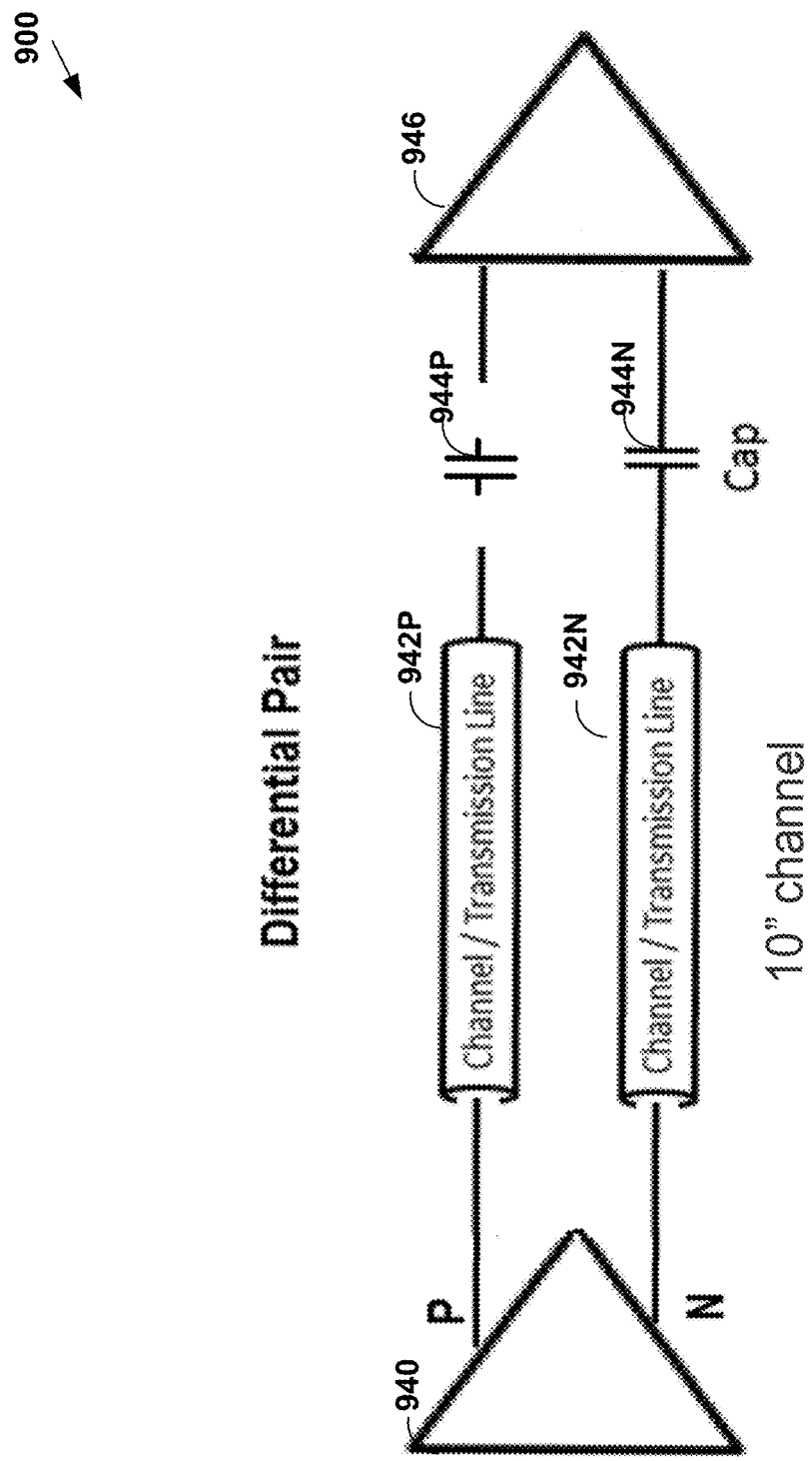
FIG. 9 is an example of a fault associated with a capacitor at a positive channel of a receiving electrical device, in accordance with one or more examples described in this disclosure.

FIG. 9 is an example of a fault associated with a capacitor 944P at a positive channel of a receiving electrical device, in accordance with one or more examples described in this disclosure. As shown, FIG. 9 includes a transmitting electronic device 940, trace 942P and N, capacitors 944P and N, and receiving electronic device 946. FIG. 9 is discussed with reference to FIGS. 1-8 for exemplary purposes only. Transmitting electronic device 940 may be an example of transmitting electronic device 340 of FIG. 3. Trace 942P may be an example of trace 342 of FIG. 3 and trace 942N may be an example of trace 342 of FIG. 3. Capacitor 944P may be an example of capacitor 344 of FIG. 3 and capacitor 944N may be an example of capacitor 344 of FIG. 3. Receiving electronic device 946 may be an example of receiving electronic device 346 of FIG. 3.

Receiving electronic device 946 may determine whether the fault has occurred at capacitor 944P. For example, receiving electronic device 946 may determine whether the fault has occurred capacitor 944P. In some examples, transmitting electronic device 940 may determine whether the fault has occurred capacitor 944P. In some examples, another processor, for instance, processor 260 of FIG. 2 may determine whether the fault has occurred capacitor 944P.

Figure 10:
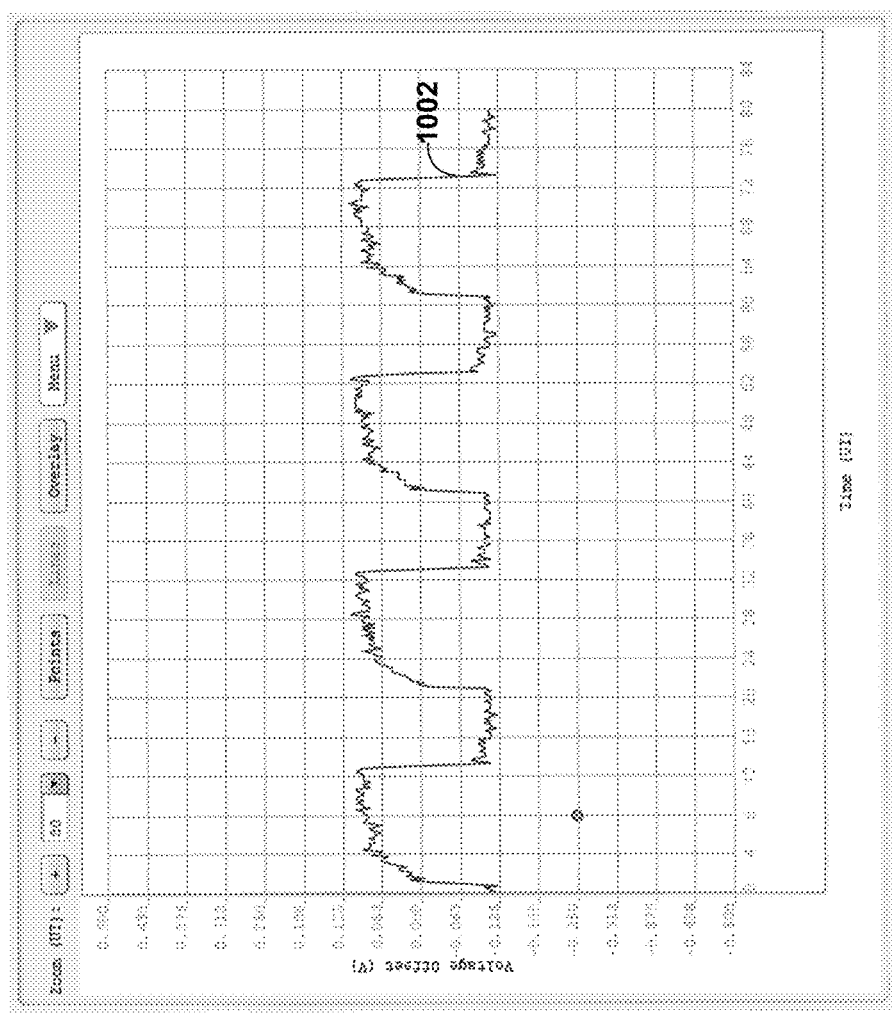
FIG. 10 is an example of a quasi-TDT electrical signature for the fault of FIG. 9, in accordance with one or more examples described in this disclosure.

FIG. 10 is an example of a quasi-TDT electrical signature 1002 for the fault of FIG. 9, in accordance with one or more examples described in this disclosure. Receiving electronic device 946 of FIG. 9 may determine whether the fault has occurred at capacitor 944P of FIG. 9. For instance, receiving electronic device 946 of FIG. 9 may determine whether the fault has occurred at capacitor 944P of FIG. 9 based on quasi-TDT electrical signature 1002. In some examples, transmitting electronic device 940 of FIG. 9 may determine whether the fault has occurred at capacitor 944P of FIG. 9 based on quasi-TDT electrical signature 1002. In some examples, another processor, for instance, processor 260 at network 236 may determine whether the fault has occurred at capacitor 944P of FIG. 9 based on quasi-TDT electrical signature 1002.

Figure 11:
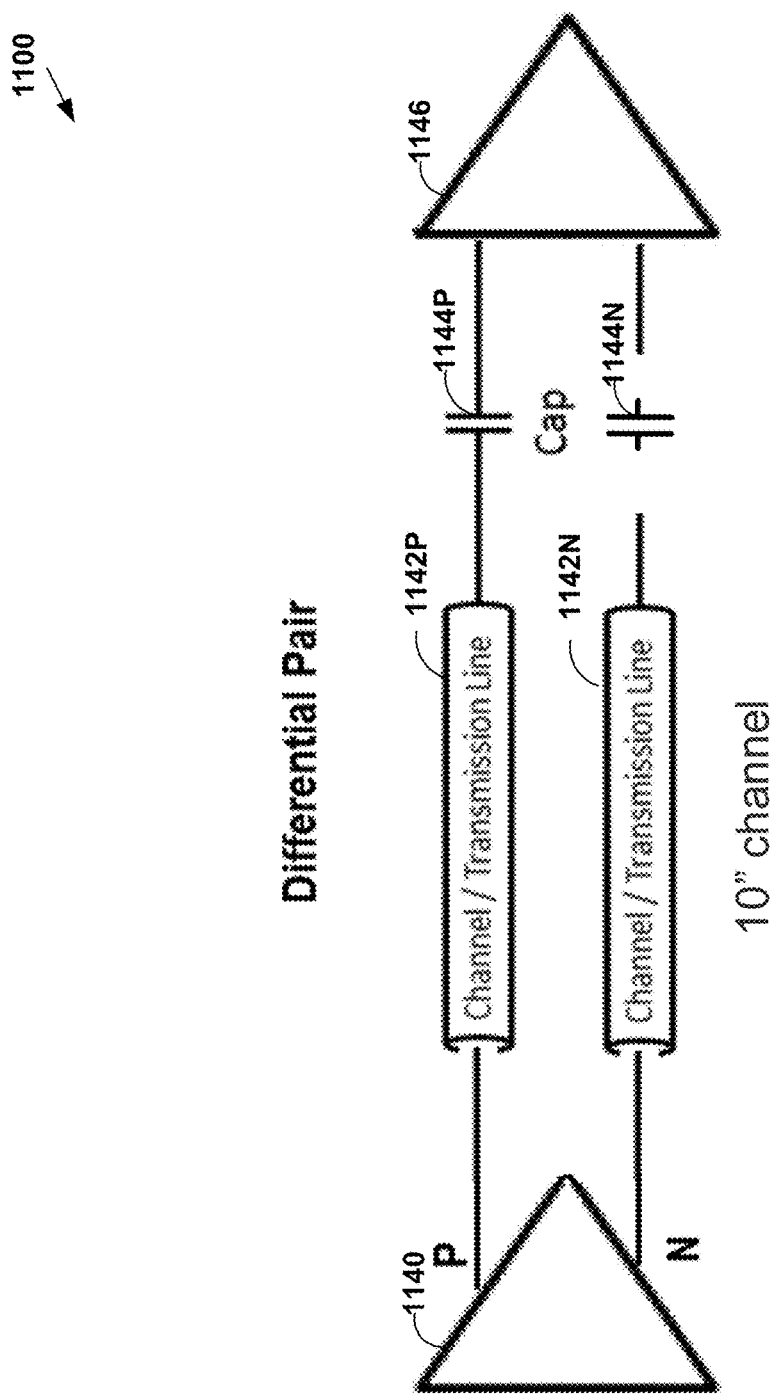
FIG. 11 is an example of a fault associated with a capacitor at a negative channel of a receiving electrical device, in accordance with one or more examples described in this disclosure.

FIG. 11 is an example of a fault associated with a capacitor at a negative channel of a receiving electrical device, in accordance with one or more examples described in this disclosure. As shown, FIG. 11 includes a transmitting electronic device 1140, traces 1142P and N, capacitors 1144P and N, and receiving electronic device 1146. FIG. 11 is discussed with reference to FIGS. 1-10 for exemplary purposes only. Transmitting electronic device 1140 may be an example of transmitting electronic device 340 of FIG. 3. Trace 1142P may be an example of trace 342 of FIG. 3 and trace 1142N may be an example of trace 342 of FIG. 3. Capacitor 1144P may be an example of capacitor 344 of FIG. 3 and capacitor 1144N may be an example of capacitor 344 of FIG. 3. Receiving electronic device 1146 may be an example of receiving electronic device 346 of FIG. 3.

Receiving electronic device 1146 may determine whether the fault has occurred at capacitor 1144N. In some examples, transmitting electronic device 1140 may determine whether the fault has occurred capacitor 1144N. In some examples, another processor, for instance, processor 260 of FIG. 2 may determine whether the fault has occurred capacitor 1144N.

Figure 12:
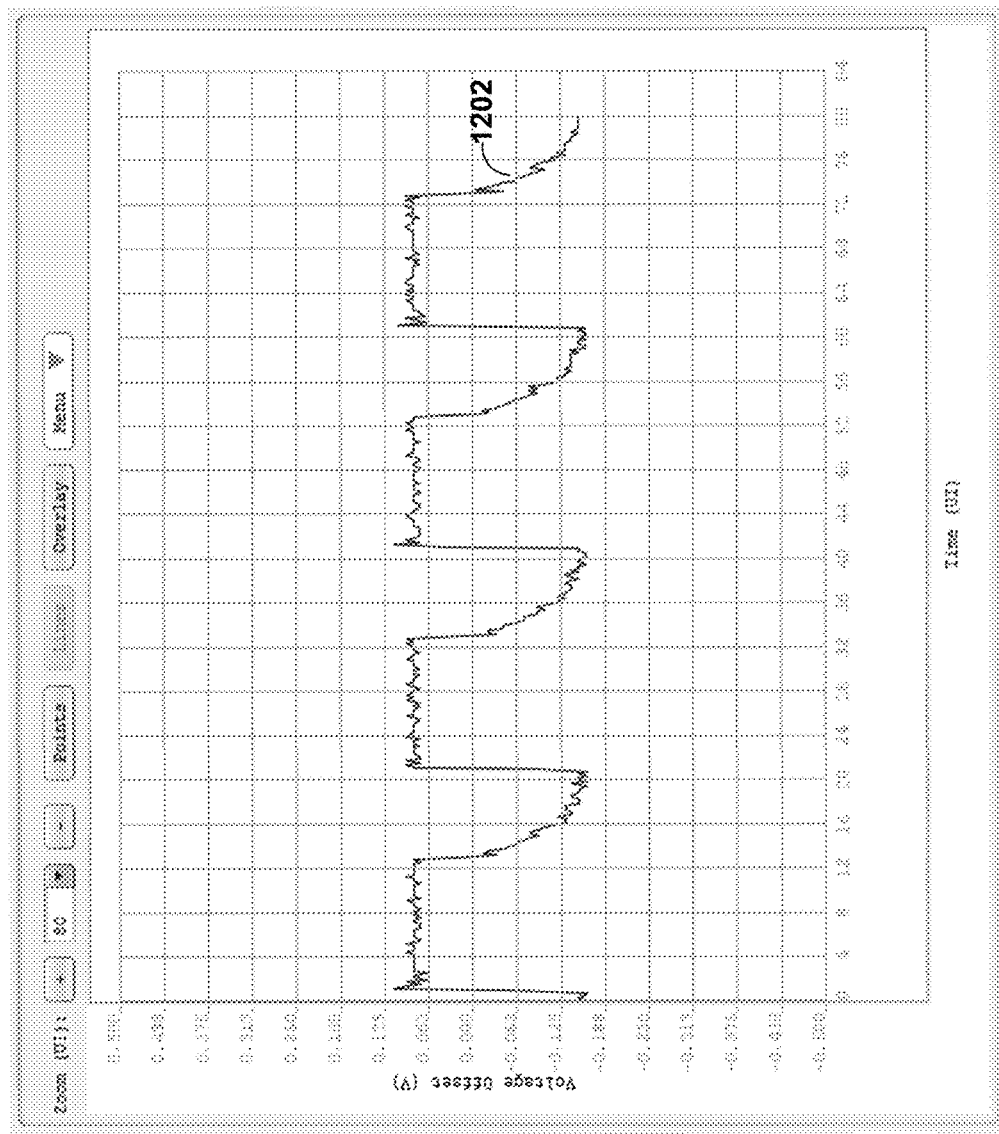
FIG. 12 is an example of a quasi-TDT electrical signature for the fault of FIG. 11, in accordance with one or more examples described in this disclosure.

FIG. 12 is an example of a quasi-TDT electrical signature 1202 for the fault of FIG. 11, in accordance with one or more examples described in this disclosure. System 1100 may determine whether the fault has occurred at capacitor 1144N of FIG. 11 based on quasi-TDT electrical signature 1202. For example, transmitting electronic device 1140 of FIG. 11 may determine whether the fault has occurred at capacitor 1144N of FIG. 11 based on quasi-TDT electrical signature 1202. In some examples, receiving electronic device 1146 of FIG. 11 may determine whether the fault has occurred at capacitor 1144N of FIG. 11 based on quasi-TDT electrical signature 1202. In some examples, another processor, for instance, processor 260 at network 236 may determine whether the fault has occurred at capacitor 1144N of FIG. 11 based on quasi-TDT electrical signature 1202.

Figure 13:
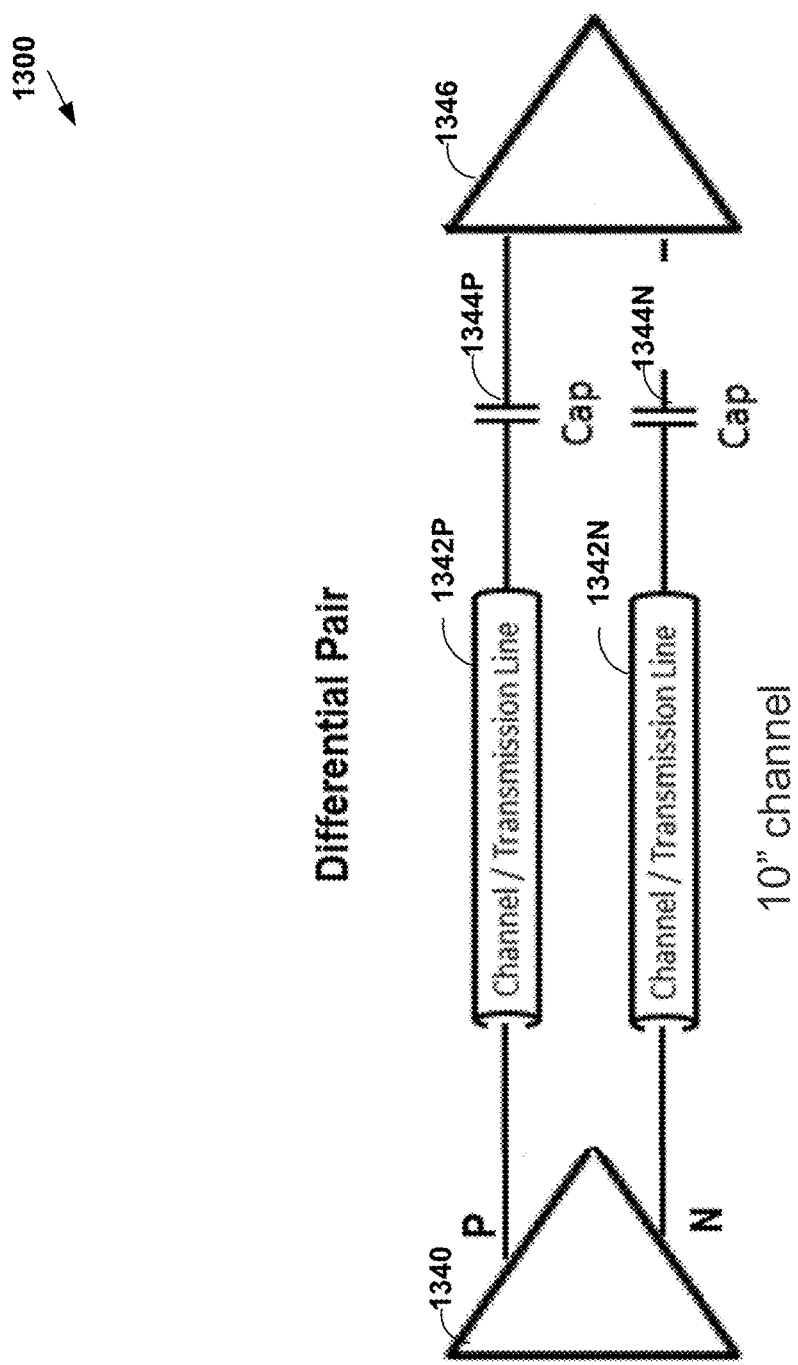
FIG. 13 is an example of a first position of a fault at a negative channel of a receiving electrical device, in accordance with one or more examples described in this disclosure.

FIG. 13 is an example of a first position of a fault at a negative channel of a receiving electrical device, in accordance with one or more examples described in this disclosure. As shown, FIG. 13 includes a transmitting electronic device 1340, transmission lines 1342P and N, capacitors 1344P and N, and receiving electronic device 1346. FIG. 13 is discussed with reference to FIGS. 1-12 for exemplary purposes only. Transmitting electronic device 1340 may be an example of transmitting electronic device 340 of FIG. 3. Transmission line 1342P may be an example of trace 342 of FIG. 3 and transmission line 1342N may be an example of trace 342 of FIG. 3. Capacitor 1344P may be an example of capacitor 344 of FIG. 3 and capacitor 1344N may be an example of capacitor 344 of FIG. 3. Receiving electronic device 1346 may be an example of receiving electronic device 346 of FIG. 3.

Receiving electronic device 1346 may determine whether a fault has occurred at capacitor 1144N. In some examples, transmitting electronic device 1140 may determine whether a fault has occurred between capacitor 1344N and receiving electronic device 1346. In some examples, another processor, for instance, processor 260 of FIG. 2 may determine whether the fault has occurred between capacitor 1344N and receiving electronic device 1346.

Figure 14:
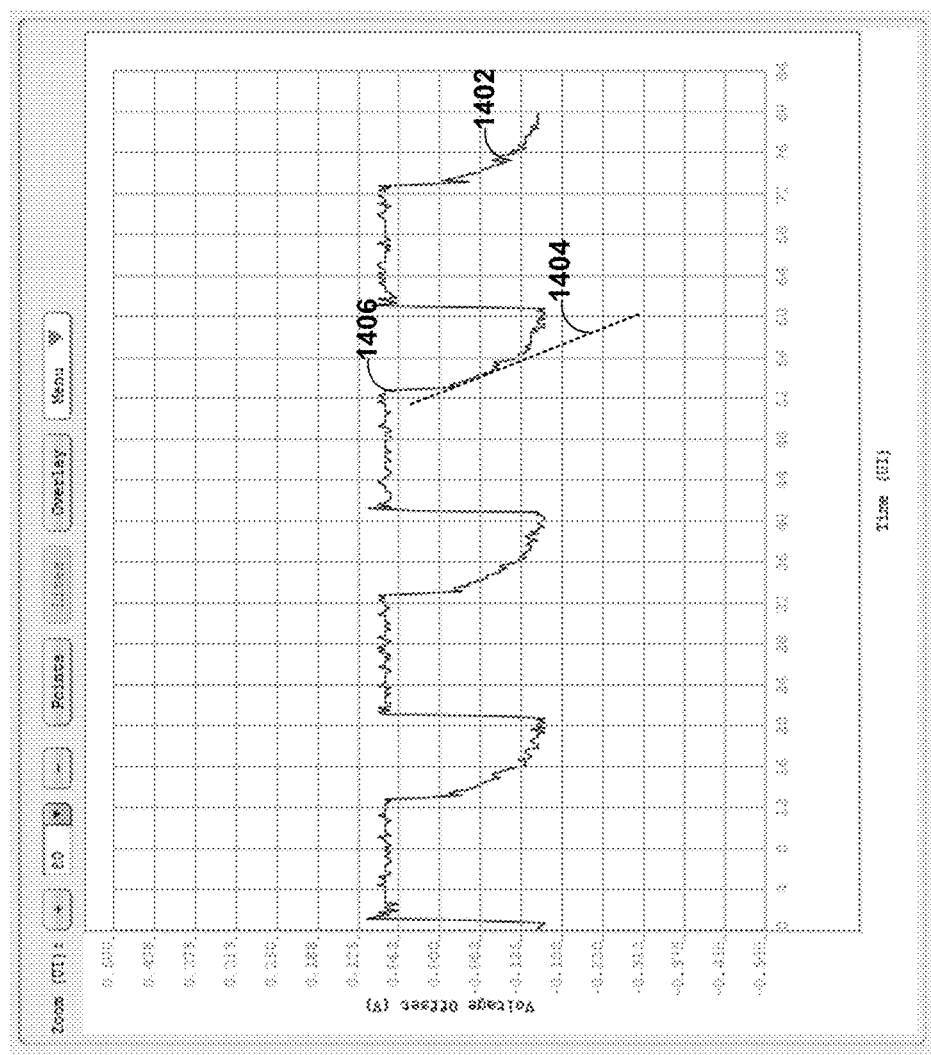
FIG. 14 is an example of a quasi-TDT electrical signature for the fault of FIG. 13, in accordance with one or more examples described in this disclosure.

FIG. 14 is an example of a quasi-TDT electrical signature 1402 for the fault of FIG. 13, in accordance with one or more examples described in this disclosure. As shown, quasi-TDT electrical signature 1402 includes time constant 1404 for a falling time of edge 1406 in the quasi-TDT electrical signature 1402.

System 1300 of FIG. 13 may determine whether the fault has occurred between capacitor 1344N of FIG. 13 and receiving electronic device 1346 of FIG. 13 based on quasi-TDT electrical signature 1402. For example, transmitting electronic device 1340 of FIG. 13 may determine whether the fault has occurred between capacitor 1344N of FIG. 13 and receiving electronic device 1346 of FIG. 13 based on quasi-TDT electrical signature 1402. In some examples, receiving electronic device 1346 of FIG. 13 may determine whether the fault has occurred between capacitor 1344N of FIG. 13 and receiving electronic device 1346 of FIG. 13 based on quasi-TDT electrical signature 1402. For instance, in response to determining that time constant 1404 at a falling edge of quasi-TDT electrical signature 1402 satisfies a threshold (e.g., is greater than 0.126 volts per 4 microseconds), transmitting electronic device 1340 of FIG. 13 may determine that the fault has occurred between transmitting electronic device 1340 of FIG. 13 and transmission line 1342N of FIG. 13. In some examples, receiving electronic device 1346 of FIG. 13 may determine whether the fault has occurred between capacitor 1344N of FIG. 13 and receiving electronic device 1346 of FIG. 13 based on time constant 1404. In some examples, another processor, for instance, processor 260 at network 236 may determine whether the fault has occurred between capacitor 1344N of FIG. 13 and receiving electronic device 1346 of FIG. 13 based on quasi-TDT electrical signature 1402.

Figure 15:
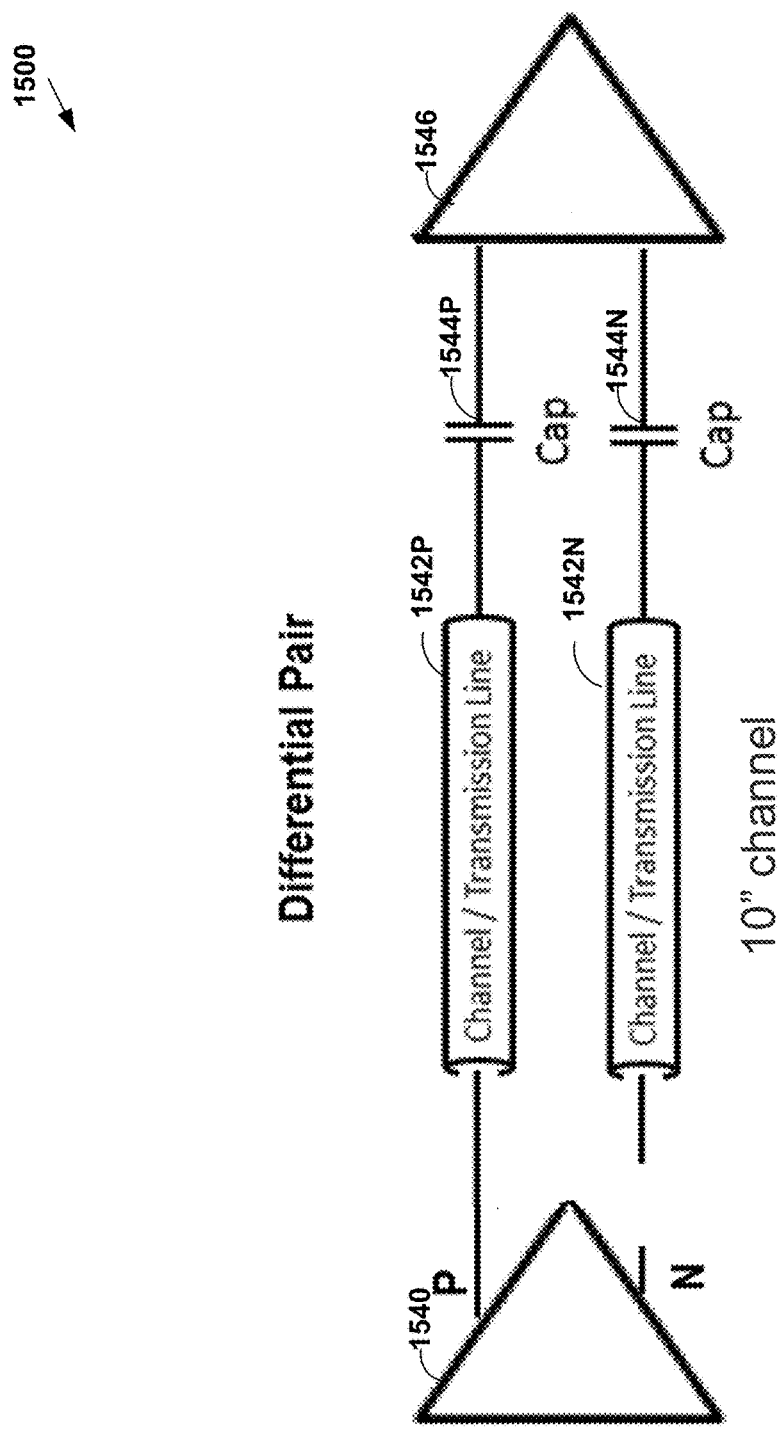
FIG. 15 is an example of a second position of a fault at a negative channel of a transmitting electrical device, in accordance with one or more examples described in this disclosure.

FIG. 15 is an example of a second position of a fault at a negative channel of a transmitting electrical device, in accordance with one or more examples described in this disclosure. As shown, FIG. 15 includes a transmitting electronic device 1540, traces 1542P and N, capacitors 1544P and N, and receiving electronic device 1546. FIG. 15 is discussed with reference to FIGS. 1-14 for exemplary purposes only. Transmitting electronic device 1540 may be an example of transmitting electronic device 340 of FIG. 3. Trace 1542P may be an example of trace 342 of FIG. 3 and trace 1542N may be an example of trace 342 of FIG. 3. Capacitor 1544P may be an example of capacitor 344 of FIG. 3 and capacitor 1544N may be an example of capacitor 344 of FIG. 3. Receiving electronic device 1546 may be an example of receiving electronic device 346 of FIG. 3.

Receiving electronic device 1546 may determine whether the fault has occurred between transmitting electronic device 1540 and trace 1542N. In some examples, transmitting electronic device 1540 may determine whether the fault has occurred between transmitting electronic device 1540 and trace 1542N. In some examples, another processor, for instance, processor 260 of FIG. 2 may determine whether the fault has occurred between transmitting electronic device 1540 and trace 1542N.

Figure 16:
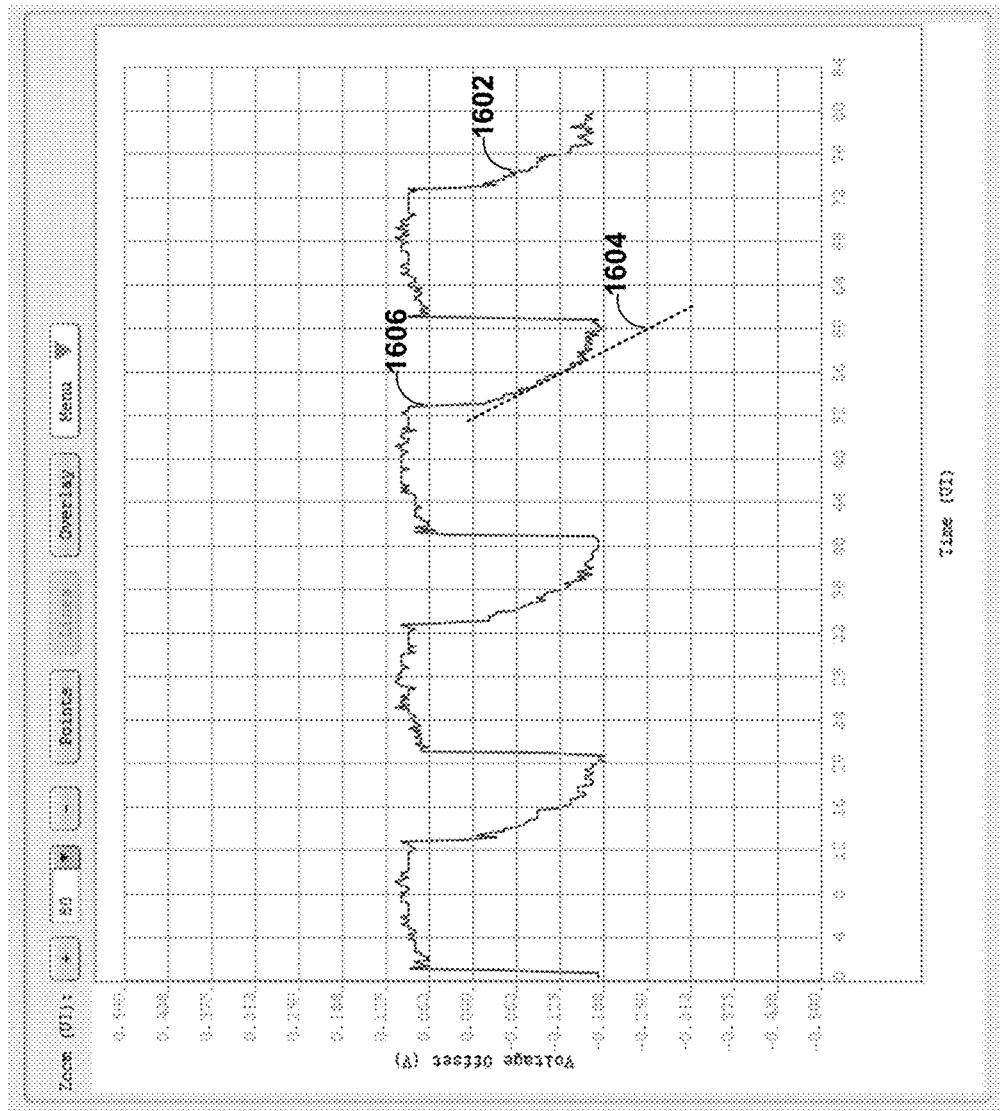
FIG. 16 is an example of a quasi-TDT electrical signature for the fault of FIG. 15, in accordance with one or more examples described in this disclosure.

FIG. 16 is an example of a quasi-TDT electrical signature 1602 for the fault of FIG. 15, in accordance with one or more examples described in this disclosure. As shown, quasi-TDT electrical signature 1602 includes time constant 1604 for a falling time of edge 1606 in the quasi-TDT electrical signature 1602.

System 1500 of FIG. 15 may determine whether the fault has occurred between transmitting electronic device 1540 of FIG. 15 and trace 1542N of FIG. 15 based on quasi-TDT electrical signature 1602. For example, transmitting electronic device 1540 of FIG. 15 may determine whether the fault has occurred between transmitting electronic device 1540 of FIG. 15 and trace 1542N of FIG. 15 based on quasi-TDT electrical signature 1602. In some examples, receiving electronic device 1546 of FIG. 15 may determine whether the fault has occurred between transmitting electronic device 1540 of FIG. 15 and trace 1542N of FIG. 15 based on quasi-TDT electrical signature 1602. For instance, in response to determining that time constant 1604 at a falling edge of quasi-TDT electrical signature 1602 satisfies a threshold (e.g., is less than 0.126 volts per 4 microseconds), transmitting electronic device 1540 of FIG. 15 may determine that the fault has occurred between transmitting electronic device 1540 of FIG. 15 and trace 1542N of FIG. 15. In some examples, receiving electronic device 1546 of FIG. 15 may determine whether the fault has occurred between capacitor 1544N of FIG. 15 and receiving electronic device 1546 of FIG. 15 based on time constant 1604. In some examples, another processor, for instance, processor 260 at network 236 may determine whether the fault has occurred between transmitting electronic device 1540 of FIG. 15 and trace 1542N of FIG. 15 based on quasi-TDT electrical signature 1602.

Figure 17:
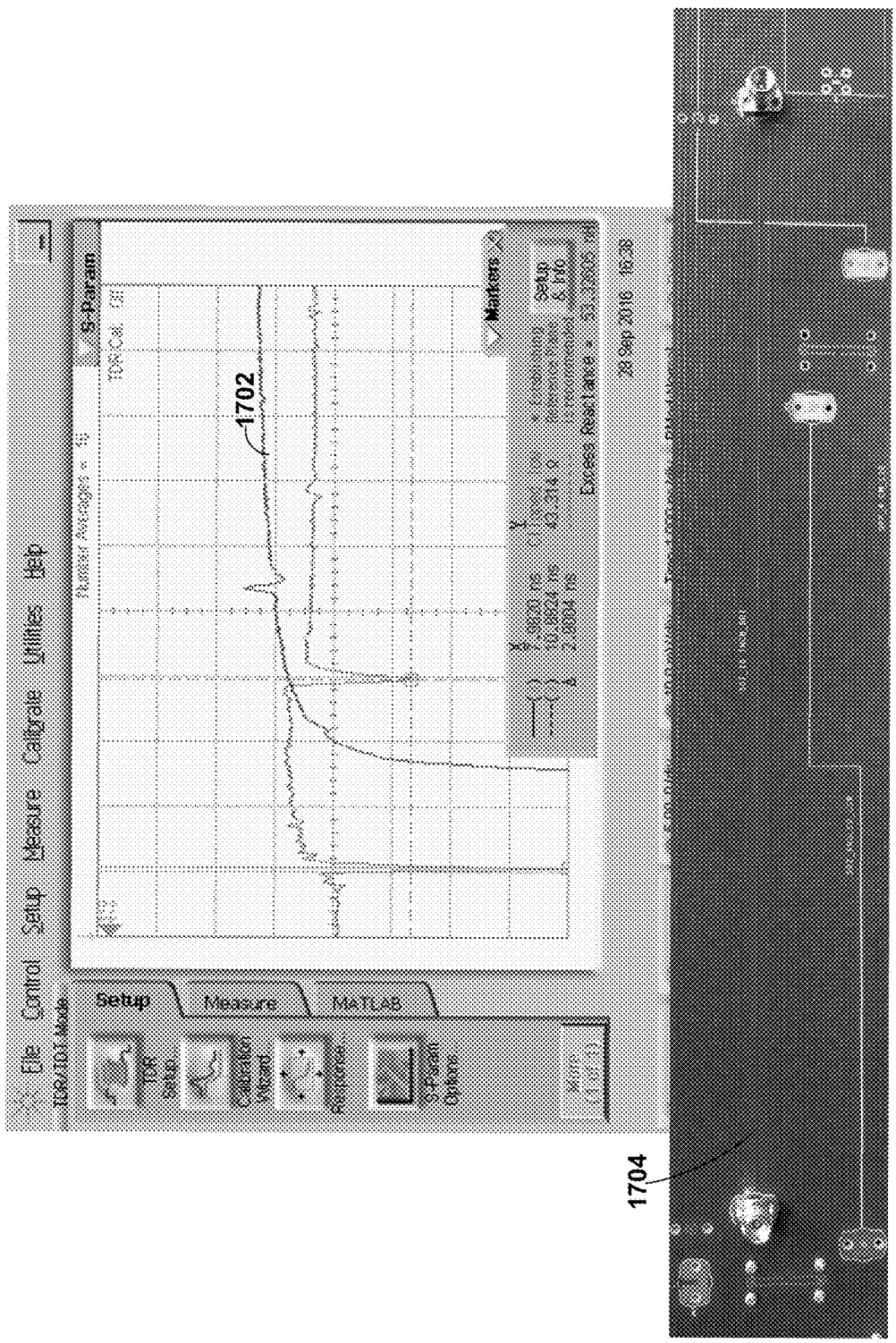
FIG. 17 is an example of a TDT electrical signature for an exemplary trace, in accordance with one or more examples described in this disclosure.

FIG. 17 is an example of a TDT electrical signature 1702 for an exemplary trace 1704, in accordance with one or more examples described in this disclosure. FIG. 17 is discussed with reference to FIGS. 1-16 for exemplary purposes only. Trace 1704 may be an example of a trace 442 of FIG. 4. Transmitting electronic device 440 of FIG. 4 may determine whether a fault has occurred within trace 1704 based on TDT electrical signature 1702. In some examples, receiving electronic device 446 of FIG. 4 may determine whether the fault has occurred within trace 1704 based on TDT electrical signature 1702. In some examples, another processor, for instance, processor 260 at network 236 may determine whether a fault has within trace 1704 based on TDT electrical signature 1702.

Figure 18:
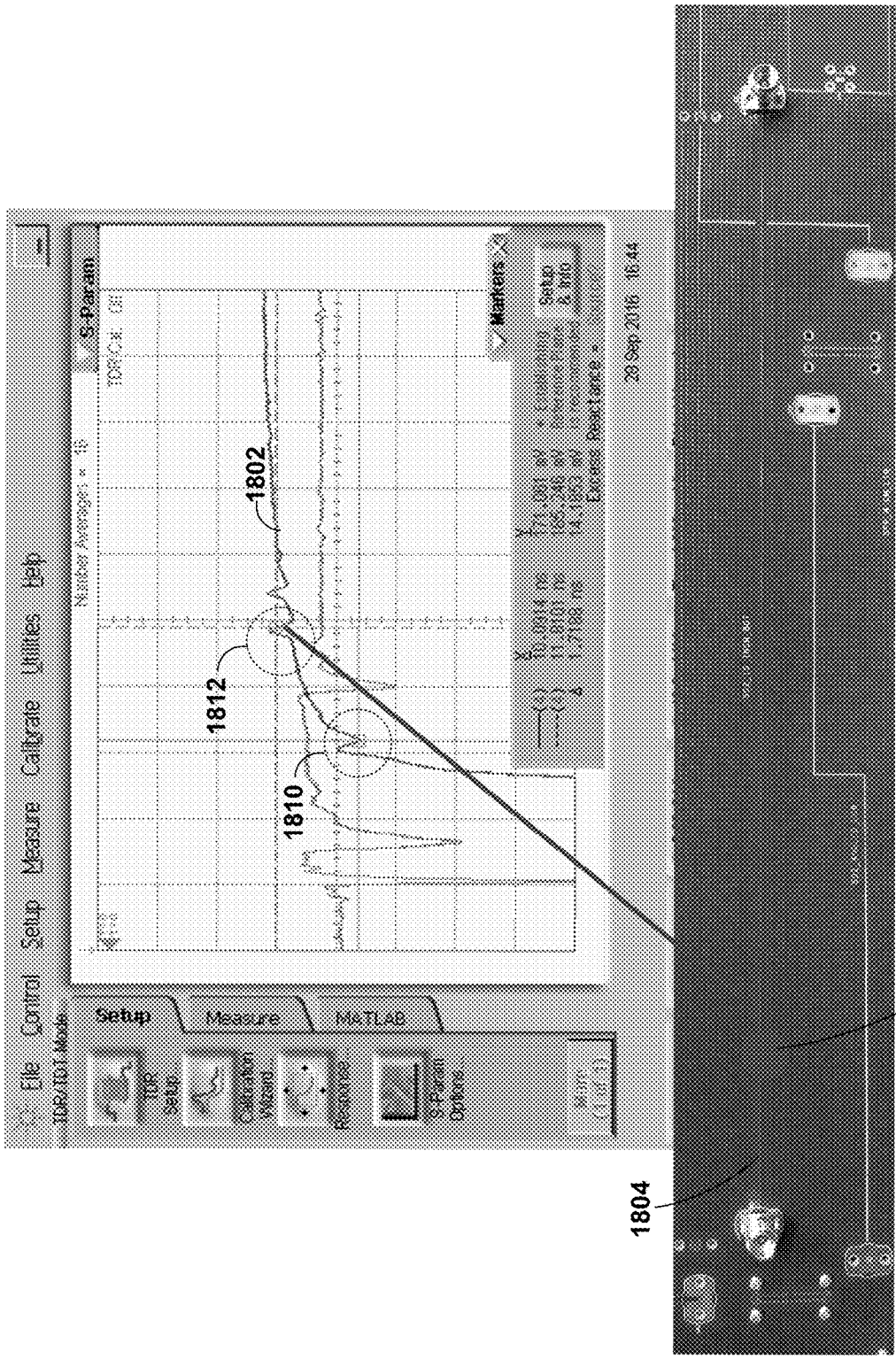
FIG. 18 is an example of a TDT electrical signature for a first fault position within an exemplary trace, in accordance with one or more examples described in this disclosure.

FIG. 18 is an example of a TDT electrical signature 1802 for a first fault position 1806 within an exemplary trace 1804, in accordance with one or more examples described in this disclosure. FIG. 18 is discussed with reference to FIGS. 1-17 for exemplary purposes only. Trace 1804 may be an example of a trace 442 of FIG. 4. As shown, TDT electrical signature 1802 may include signatures 1810 and 1812.

Transmitting electronic device 440 of FIG. 4 may determine a position of a fault within trace 1704 based on TDT electrical signature 1802. For instance, transmitting electronic device 440 of FIG. 4 may determine that the fault is at position 1806 within trace 1804 when signature 1810 and/or signature 1812 are present in TDT electrical signature 1802. In some examples, receiving electronic device 446 of FIG. 4 may determine whether a position of a fault within trace 1804 based on TDT electrical signature 1802. For instance, receiving electronic device 446 of FIG. 4 may determine that the fault is at position 1806 within trace 1804 when signature 1810 and/or signature 1812 are present in TDT electrical signature 1802. In some examples, another processor, for instance, processor 260 at network 236 may determine a position of a fault within trace 1804 based on TDT electrical signature 1802.

Figure 19:
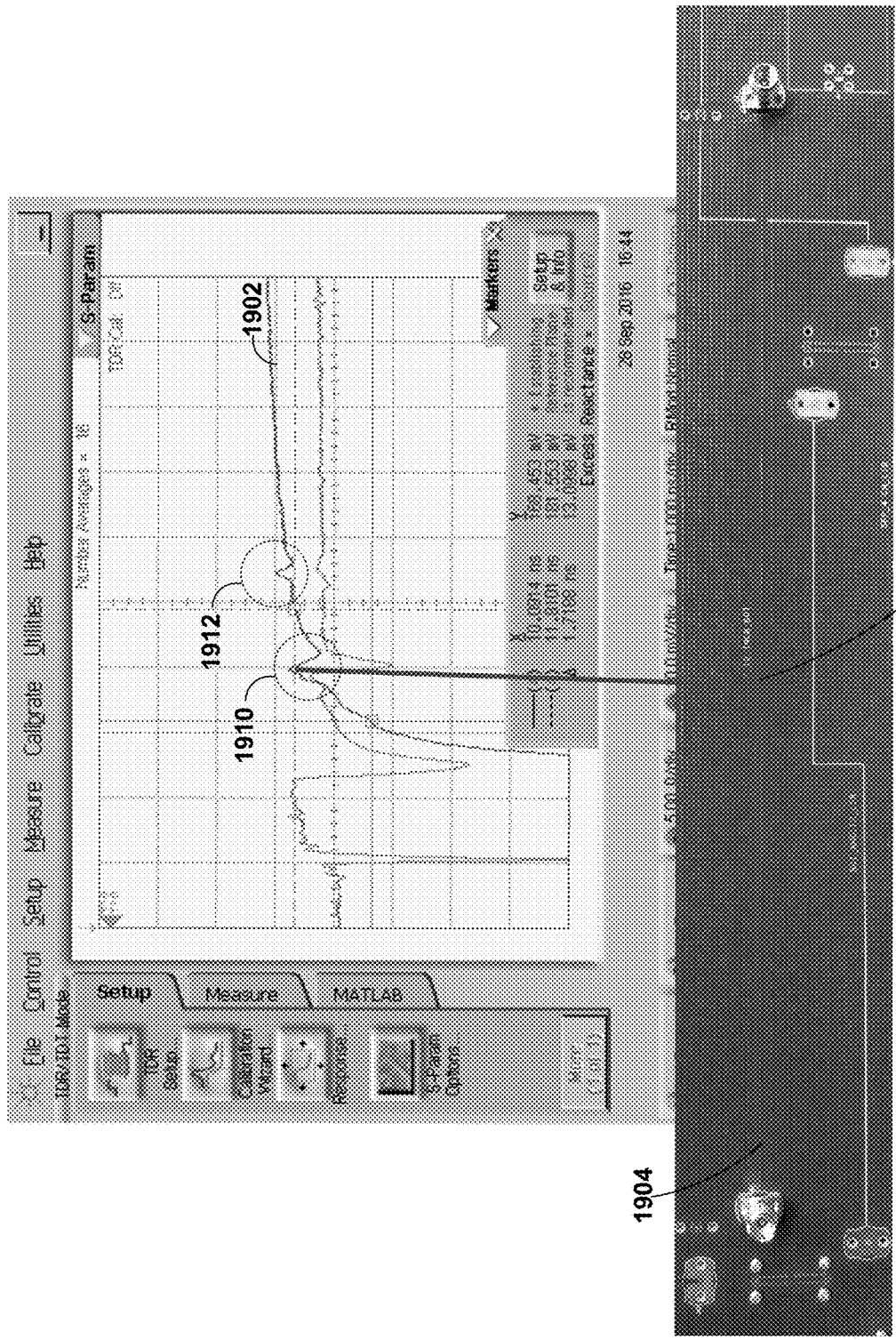
FIG. 19 is an example of a TDT electrical signature for a second fault position within an exemplary trace, in accordance with one or more examples described in this disclosure.

FIG. 19 is an example of an electrical signature for a second fault position within an exemplary trace, in accordance with one or more examples described in this disclosure. FIG. 19 is discussed with reference to FIGS. 1-18 for exemplary purposes only. Trace 1904 may be an example of a trace 442 of FIG. 4. As shown, TDT electrical signature 1902 may include signatures 1910 and 1912.

Transmitting electronic device 440 of FIG. 4 may determine a position of a fault within trace 1904 based on TDT electrical signature 1902. For instance, transmitting electronic device 440 of FIG. 4 may determine that the fault is at position 1906 within trace 1904 when signature 1910 and/or signature 1912 are present in TDT electrical signature 1902. In some examples, receiving electronic device 446 of FIG. 4 may determine whether a position of a fault within trace 1904 based on TDT electrical signature 1902. For instance, receiving electronic device 446 of FIG. 4 may determine that the fault is at position 1906 within trace 1904 when signature 1910 and/or signature 1912 are present in TDT electrical signature 1902. In some examples, another processor, for instance, processor 260 at network 236 may determine a position of a fault within trace 1904 based on TDT electrical signature 1902.

Figure 20:
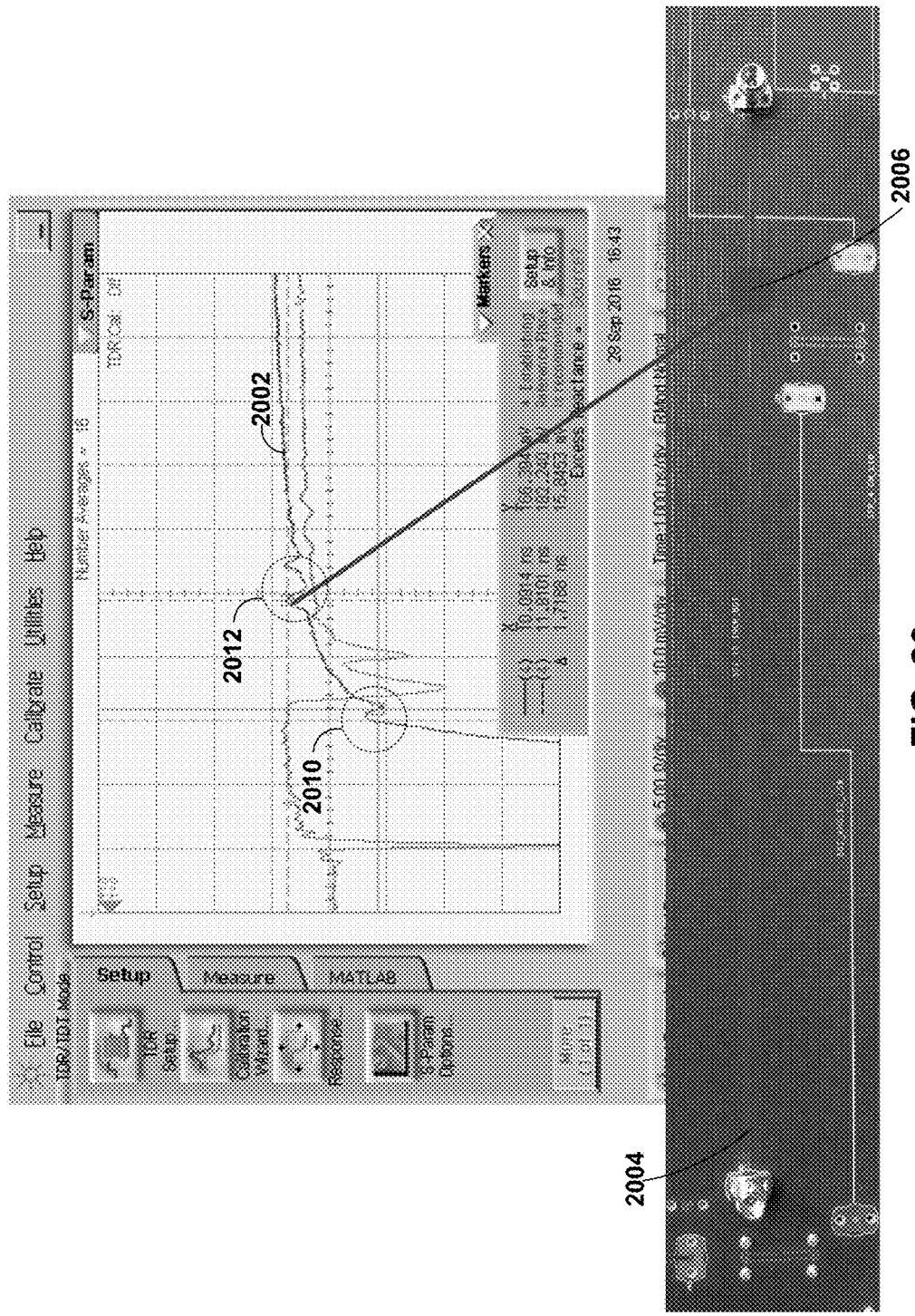
FIG. 20 is an example of a TDT electrical signature for a third fault position within an exemplary trace, in accordance with one or more examples described in this disclosure.

FIG. 20 is an example of an electrical signature for a third fault position within an exemplary trace, in accordance with one or more examples described in this disclosure. FIG. 20 is discussed with reference to FIGS. 1-19 for exemplary purposes only. Trace 2004 may be an example of a trace 442 of FIG. 4. As shown, TDT electrical signature 2002 may include signatures 2010 and 2012.

Transmitting electronic device 440 of FIG. 4 may determine a position of a fault within trace 2004 based on TDT electrical signature 2002. For instance, transmitting electronic device 440 of FIG. 4 may determine that the fault is at position 2006 within trace 2004 when signature 2010 and/or signature 2012 are present in TDT electrical signature 2002. In some examples, receiving electronic device 446 of FIG. 4 may determine whether a position of a fault within trace 2004 based on TDT electrical signature 2002. For instance, receiving electronic device 446 of FIG. 4 may determine that the fault is at position 2006 within trace 2004 when signature 2010 and/or signature 2012 are present in TDT electrical signature 2002. In some examples, another processor, for instance, processor 260 at network 236 may determine a position of a fault within trace 2004 based on TDT electrical signature 2002.

Figure 21:
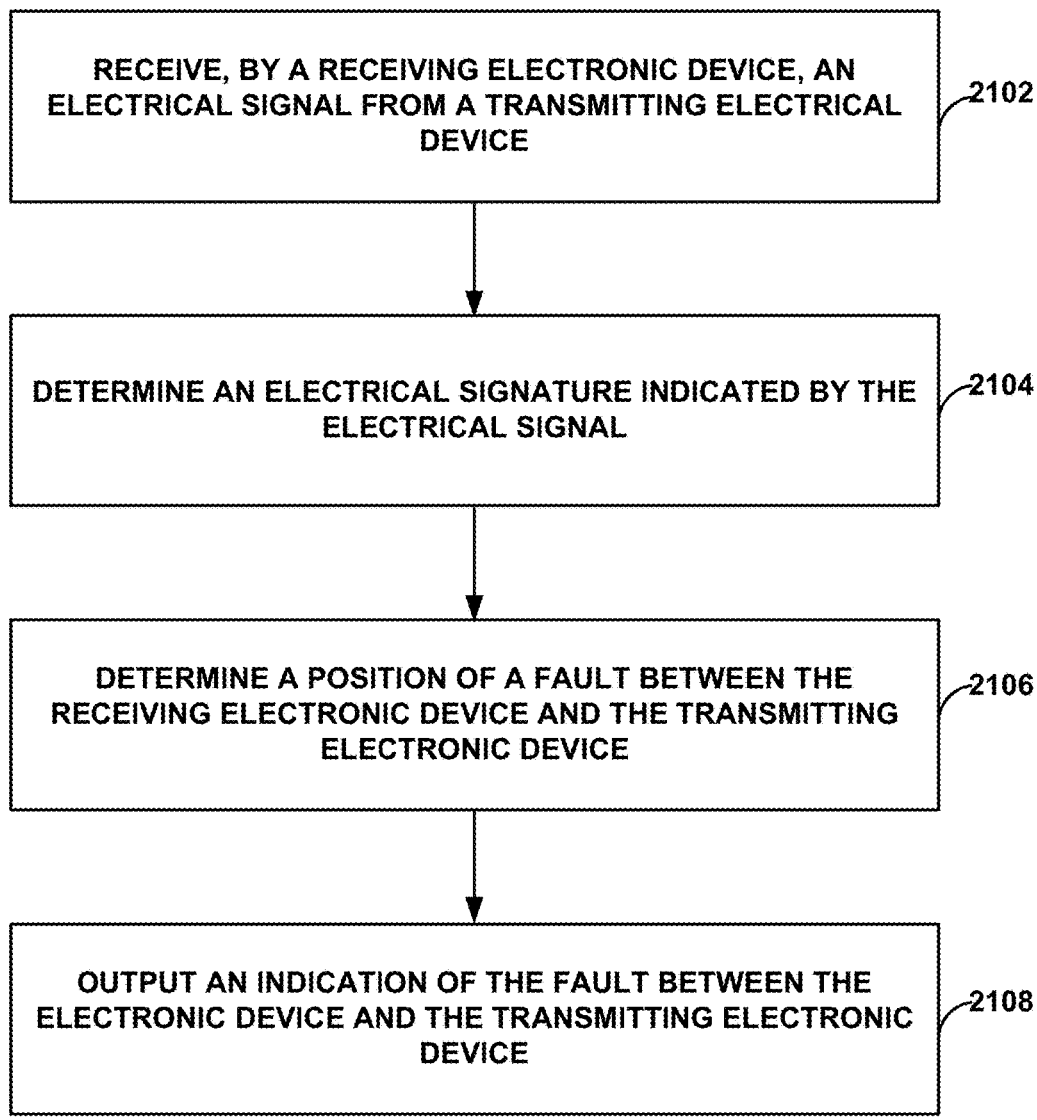
FIG. 21 is a flowchart illustrating an example technique in accordance with one or more aspects of this disclosure.

FIG. 21 is a flowchart illustrating an example technique in accordance with one or more aspects of this disclosure. For example, the technique illustrated in FIG. 21 may be applicable to transmitting electronic device 340 of FIG. 3 and receiving electronic device 346 of FIG. 3. For purposes of illustration only, reference is made to FIGS. 1-16.

Receiving electronic device 346 receives an electrical signal from a transmitting electrical device 340 (2102). One or more processors determine an electrical signal indicated by the electrical signature (2104). For example, receiving electronic device 346 determines the electrical signature indicated by the electrical signal. In some examples, transmitting electronic device 340 determines the electrical signature indicated by the electrical signal. The one or more processors, determine a position of the fault between the receiving transmitting electronic device 340 and receiving electronic device 346 (2106). For example, in response to determining that a time constant indicated by the electrical signature satisfies a threshold (e.g., is less than 0.063 volts per 4 microseconds), receiving electronic device 346 may determine that the fault has occurred between capacitor 344 and receiving electronic device 346. In some examples, transmitting electronic device 340 determines the position of the fault between the receiving transmitting electronic device 340 and receiving electronic device 346. The one or more processors, output an indication of the fault between receiving transmitting electronic device 340 and receiving electronic device 346 (2108). For example, receiving electronic device 346 outputs an indication of the fault between receiving transmitting electronic device 340 and receiving electronic device 346. In some examples, transmitting electronic device 340 outputs an indication of the fault between receiving transmitting electronic device 340 and receiving electronic device 346. Accordingly, in some examples, transmitting electronic device 340 and/or receiving electronic device 346 may self-detect a position of a fault between receiving transmitting electronic device 340 and receiving electronic device 346.

The techniques of this disclosure may be implemented in a wide variety of devices or apparatuses, including linecards, routers, optical interfaces, an integrated circuit (IC) or a set of ICs (i.e., a chip set). Various components, modules or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units.

Various examples have been described. These and other examples are within the scope of the following claims.

The invention claimed is:

1. A system for communication, the system comprising:
   a first card comprising:
      a pluggable interface; and
      a processor configured to:
         generate, from an electrical function, an electrical signal; and
         transmit, at the pluggable interface, the electrical signal;

a second card comprising:
  a pluggable interface configured to receive, from the first card, the electrical signal, wherein the received electrical signal is different than the electrical signal transmitted by the first card;
  a receiving (Rx) serializer/deserializer (SerDes) configured to convert the received electrical signal into a received digital electrical signal; and
a backplane comprising:
  a first receiving interface configured to receive the pluggable interface of the first card;
  a second receiving interface configured to receive the pluggable interface of the second card; and
  a trace configured to electronically couple the first receiving interface and the second receiving interface,
wherein one or more processors are configured to:
  determine an electrical signature of the received electrical signal from the received digital electrical signal when the received electrical signal is received by the second card; and
  determine, based on the electrical signature, a position of a fault between the first card and the second card, wherein the fault causes the received electrical signal to be different than the electrical signal transmitted by the first card.

2. The system of claim 1, wherein the one or more processors are configured to:
  determine, based on the electrical signature, a time constant for the received electrical signal, wherein the time constant is a measure of a rise or fall time of an edge in the received electrical signal, and
  wherein the one or more processors are configured to determine the position of the fault between the first and second cards based on the time constant for the received electrical signal.

3. The system of claim 1, wherein the one or more processors are further configured to:
  determine, based on the electrical signature, whether the fault is positioned between the first receiving interface and the pluggable interface of the first card.

4. The system of claim 1, wherein one or more processors are further configured to:
  determine, based on the electrical signature, whether the fault is positioned between the second receiving interface and the pluggable interface of the second card.

5. The system of claim 1, wherein the first card is a line card and the second card is a fabric card or the first card is a fabric card and the second card is a line card.

6. The system of claim 1, wherein the one or more processors are operable at the first card or the second card.

* * * * *